US007220306B2

(12) United States Patent
Kano et al.

(10) Patent No.: US 7,220,306 B2
(45) Date of Patent: *May 22, 2007

(54) TREATED PIGMENT, USE THEREOF, AND COMPOUND FOR TREATING PIGMENT

(75) Inventors: Masanori Kano, Osaka (JP); Kazunori Itoh, Osaka (JP); Naoyuki Kitaoka, Osaka (JP); Takaaki Yodo, Osaka (JP); Hideo Shibata, Osaka (JP)

(73) Assignee: Sakata INK Corp., Osaka (JP)

( * ) Notice: Subject to any disclaimer, the term of this patent is extended or adjusted under 35 U.S.C. 154(b) by 37 days.

This patent is subject to a terminal disclaimer.

(21) Appl. No.: 10/507,012

(22) PCT Filed: Mar. 10, 2003

(86) PCT No.: PCT/JP03/02772

§ 371 (c)(1),
(2), (4) Date: May 12, 2005

(87) PCT Pub. No.: WO03/076527

PCT Pub. Date: Sep. 18, 2003

(65) Prior Publication Data

US 2005/0204959 A1    Sep. 22, 2005

(30) Foreign Application Priority Data

Mar. 8, 2002 (JP) ............................ 2002-064416
Mar. 18, 2002 (JP) ............................ 2002-074966
Mar. 27, 2002 (JP) ............................ 2002-089231
Jun. 26, 2002 (JP) ............................ 2002-186838

(51) Int. Cl.
C09C 3/10 (2006.01)
C09C 1/48 (2006.01)
C09B 67/00 (2006.01)
C09B 67/20 (2006.01)
C08K 5/29 (2006.01)
C07C 249/02 (2006.01)
G03C 1/00 (2006.01)
G03F 7/004 (2006.01)
G02B 5/20 (2006.01)
G02B 5/00 (2006.01)

(52) U.S. Cl. ...................... 106/476; 106/493; 106/499; 430/270.1; 524/495; 564/252

(58) Field of Classification Search ................ 106/476, 106/493, 499; 524/495; 564/252; 430/270.1
See application file for complete search history.

(56) References Cited

U.S. PATENT DOCUMENTS

| 4,049,610 | A | | 9/1977 | Bunge et al. | |
|---|---|---|---|---|---|
| 5,371,148 | A | * | 12/1994 | Taylor et al. | 525/293 |
| 5,439,982 | A | * | 8/1995 | Taylor et al. | 525/293 |
| 5,602,264 | A | * | 2/1997 | Rapoport et al. | 549/448 |
| 6,730,807 | B1 | * | 5/2004 | Haberle et al. | 562/439 |
| 7,049,001 | B2 | * | 5/2006 | Haberle et al. | 428/423.1 |
| 2003/0088030 | A1 | * | 5/2003 | Haberle et al. | 525/326.6 |
| 2005/0118424 | A1 | * | 6/2005 | Takahashi et al. | 428/402 |
| 2006/0094851 | A1 | * | 5/2006 | Audenaert et al. | 528/44 |

FOREIGN PATENT DOCUMENTS

| JP | 54-37082 | 3/1979 |
|---|---|---|
| JP | 9-166869 | 6/1997 |
| JP | 2002-201381 | 7/2002 |

* cited by examiner

*Primary Examiner*—Anthony J. Green
(74) *Attorney, Agent, or Firm*—Westerman, Hattori, Daniels & Adrian, LLP.

(57) ABSTRACT

The present invention provides a treated pigment produced by treating at least one pigment selected from the group consisting of organic pigments and carbon black each having a functional group reactive with a carbodiimide group with a carbodiimide compound having one or more carbodiimide groups, said carbodiimide compound having, within the molecule thereof, at least one side chain selected from the group consisting of polyester side chains, polyether side chains and polyacrylic side chains, with a carbodiimide equivalent of 100 to 50,000.

9 Claims, No Drawings

TREATED PIGMENT, USE THEREOF, AND COMPOUND FOR TREATING PIGMENT

TECHNICAL FIELD

The present invention relates to a treated pigment and a use thereof and, more particularly, to a treated pigment intended for use not only in ordinary printing inks and paints but also in colorant compositions required to show good fluidity and dispersion stability in a finely dispersed state at high concentrations and, in relation to a use thereof, to a pigment dispersion-based resist composition enabling the manufacture of color filters having good contrast and high transmissivity characteristics and black matrices having excellent shielding and high insulating characteristics. The invention also relates to a compound for treating a pigment which is suited for the treatment of an organic pigment or carbon black each having a functional group reactive with a carbodiimide group.

BACKGROUND ART

It is a current tendency to utilize pigments as colorants not only in various inks and paints but also in those fields in which clearer colorations are required, for example in color filters and inks for ink jet printing.

In recent years, marked advances have been made in the technology of dispersing such pigments. The method which is used for further rationalization of production processes comprises carrying out dispersion so as to increase the pigment concentration as far as possible. However, there is a fundamental problem that as the pigment concentration increases, the fluidity and dispersion stability decrease.

In addition, in the fields of color filters and ink jet recording, where high levels of fastness are required, it is necessary to use high-grade pigments and reduce the particle diameter to a finer level so that clearer colorations may be accomplished. However, high-grade pigments are by nature poor in dispersion stability as compared with other pigments and, further, as the particle diameter becomes finer, the tendency toward aggregation increases and it becomes difficult to obtain stable dispersions.

On the other hand, carbon black is widely used as a pigment showing a high level of blackness. However, it has problems, namely difficulty in attaining high concentrations thereof and insufficiency in dispersion stability due to its characteristics that its primary particle diameter is very small and it is porous and has a large specific surface area. Recently, attempts have been made to use carbon black also as a light-shielding material for black matrices. It is a problem, however, that it is difficult to obtain highly insulating black matrices from carbon black which is highly conductive.

Therefore, for solving such problems, investigations have so far been made concerning, for example, the treatment (surface treatment/modification) of pigments themselves or the development of pigment dispersants, pigment derivatives or surfactants, each having marked ability to wet (being adsorbed on) pigments and/or be wetted to increase the pigment dispersion stability and/or pigment concentration, and a number of research works are now still going on.

Thus, for example, Japanese Kokai Publication Sho-54-037082 discloses a method of attaining good pigment dispersion stability by utilizing a basic group-containing pigment dispersant for dispersing acidic pigments and thus allowing the pigment dispersant to be adsorbed on the pigment surface through acid-base affinity. However, such a force as acid-base affinity cannot be said to be sufficiently effective in causing the pigment dispersant to be adsorbed on the pigment surface, hence the resulting pigment dispersions can never be applied as such materials for the color filters or the inks for ink jet printing as mentioned above.

There is also available a method of stably dispersing minute pigment particles which comprises using a pigment dispersant in increased amounts. However, when the pigment dispersions obtained by this method are used in pigment dispersion-based resist compositions for color filters or black matrices, a problem arises, namely deterioration in developability.

Further, in Japanese Kokai Publication Hei-09-166869, there is disclosed a method of grafting a dispersant having an aziridine, isocyanate, epoxy or the like functional group onto a carboxyl or the like functional group-containing modification of carbon black through reaction with the carboxyl group. This method, however, cannot yet achieve improvements in fluidity and/or dispersion stability at high concentrations.

Therefore, the applicant first paid attention to a carbodiimide group highly reactive with a carboxyl group, in particular, as means for improving the dispersibility of carbon black by grafting thereof and thus developed and proposed, in Japanese Kokai Publication 2002-201381, a treated carbon black species capable of being maintained in a finely dispersed state very stably as obtained by grafting a dispersant having that group within the molecule onto the surface of carbon black.

Such a treated carbon black species as proposed by the applicant is utilized in inks, paints and the like and, in addition, since the coat layer formed using the same has high levels of insulating and light-shielding properties, it can be used also in resist compositions for producing highly insulating black matrices.

For enabling the formation of coat layers with higher levels of light-shielding and insulating properties, however, there is room for contrivance for improving such fundamental performance characteristics as high carbon black concentrations and dispersion stability. Further, in cases where the range of application is to be extended to the dispersion of organic pigments, there is a limit.

SUMMARY OF THE INVENTION

It is an object of the present invention to provide a treated pigment which can be suitably applied in such fields as color filters and ink jet recording where it is necessary to disperse pigments still more finely and which can retain good dispersion stability and fluidity. Another object is to provide a pigment dispersion-based resist composition which can give color filters high in permeability and excellent in contrast and so on or black matrices high in light-shielding and insulating properties. A further object is to provide a compound for treating an organic pigment and carbon black each having a functional group reactive with a carbodiimide group.

As a result of intensive investigations made to accomplish the above objects, the present inventors found that all the above objects can be attained when a treated pigment derived from a pigment having a functional group reactive with a carbodiimide group by treatment with a carbodiimide compound having at least one side chain selected from the group consisting of polyester side chains, polyether side chains and polyacrylic side chains. Based on such and other findings, the present invention has been completed.

Thus, the present invention relates to (1) a treated pigment produced by treating at least one pigment selected from the group consisting of organic pigments and carbon black each having a functional group reactive with a carbodiimide group with a carbodiimide compound having one or more carbodiimide groups, said carbodiimide compound having, within the molecule thereof, at least one side chain selected from the group consisting of polyester side chains, polyether side chains and polyacrylic side chains, with a carbodiimide equivalent of 100 to 50,000.

The invention further relates to (2) the treated pigment according to the above (1), wherein the carbodiimide compound is one resulting from intramolecular introduction of at least one side chain selected from the group consisting of polyester side chains, polyether side chains and polyacrylic side chains each having a functional group reactive with a carbodiimide group by reaction of the side chain with the carbodiimide group.

Further, the invention relates to (3) the treated pigment according to the above (1), wherein the carbodiimide compound is one resulting from reaction between a compound having a functional group reactive with a carbodiimide group and the carbodiimide group, followed by intramolecular introduction of a compound forming at least one species selected from the group consisting of polyester side chains, polyether side chains and polyacrylic side chains.

The invention further relates to (4) the treated pigment according to the above (2) or (3), wherein the carbodiimide compound is one resulting from intramolecular introduction of the side chain having a carboxyl group, sulfonic acid group, phosphoric acid group, hydroxyl group or amino group as the functional group reactive with a carbodiimide group.

The invention further relates to (5) the treated pigment according to any one of the above (1) to (4), wherein the side chain is a chain having a formula weight of 200 to 10,000.

The invention further relates to (6) the treated pigment according to any one of the above (1) to (5), wherein the organic pigment or carbon black having a functional group reactive with a carbodiimide group has at least one functional group selected from the group consisting of a carboxyl group, sulfonic acid group, hydroxyl group and amino group.

The invention also relates to (7) a pigment dispersion composition which comprises the treated pigment according to any one of the above (1) to (6).

The invention further relates to (8) a pigment dispersion-based resist composition which comprises the treated pigment according to any one of the above (1) to (6).

Still further, the invention relates to (9) a compound for treating an organic pigment or carbon black having a functional group reactive with a carbodiimide group which is a carbodiimide compound having, within the molecule, at least one side chain selected from the group consisting of polyester side chains, polyether side chains and polyacrylic side chains and has a carbodiimide equivalent of 100 to 50,000.

DETAILED DESCRIPTION OF THE INVENTION

In the following, the treated pigment, the use thereof, and the compound for pigment treatment of the invention are described in detail.

The treated pigment of the present invention is one resulting from treatment of an organic pigment or carbon black having a functional group reactive with a carbodiimide group with a carbodiimide compound having at least one side chain selected from the group consisting of polyester side chains, polyether side chains and polyacrylic side chains. The treated pigment of the invention may be in the form of a pigment dispersion obtained by using a dispersion medium or the like or in the form of a dry matter obtained without using any dispersion medium.

Such a treated pigment can be provided with covalent bond-due strong adsorptivity by reacting the carbodiimide group or groups occurring within the molecule of the carbodiimide compound with a functional group occurring on the pigment surface and reactive with a carbodiimide group, for example a carboxyl, sulfonic acid or hydroxyl group. Further, when this treated pigment is dispersed in a dispersion medium and when the carbodiimide compound is one having at least one side chain selected from the group consisting of those polyester side chains, polyether side chains and polyacrylic side chains which are to be mentioned later herein, said side chain forms a domain in the dispersion medium and shows a steric hindrance effect, among others, hence it appears that the pigment can thereby be stably dispersed in the dispersion medium.

In cases where the pigment is carbon black, there presumably arises a state such that the carbon black surface is covered with such an insulating material as the carbodiimide compound, hence a pigment dispersion-based resist composition for black matrices which contains such a treated carbon black species can acquire very excellent high-level insulating properties.

First, the pigment having a functional group reactive with a carbodiimide group, which is to be used in the practice of the invention, is described.

The pigment to be used in the practice of the invention is selected from the group consisting of organic pigments and carbon black each having a functional group reactive with a carbodiimide group. Such pigments may be used singly or two or more of them may be used in combination.

Preferred as the above-mentioned organic pigments and carbon black having a functional group reactive with a carbodiimide group are ones having at least one functional group selected from the group consisting of a carboxyl group, sulfonic acid group, hydroxyl group and amino group.

The organic pigments include, among others, dye chelate pigments, azo pigments, benzimidazolone pigments, phthalocyanine pigments, quinacridone pigments, anthraquinone pigments, dioxazine pigments, indigo pigments, thioindigo pigments, perylene pigments, perinone pigments, diketopyrrolopyrrole pigments, isoindolinone pigments, nitro pigments, nitroso pigments, anthraquinone pigments, flavanthrone pigments, quinophthalone pigments, pyranthrone pigments, indanthrone pigments, and like organic pigments.

In the case of organic pigments having no functional group reactive with a carbodiimide group on the surface, such a functional group can be introduced onto the surface thereof by surface treatment, for example, by the plasma treatment or oxygen/ultraviolet light treatment described in "Ganryo Bunsan Anteika to Hyomen Shori Gijyutsu: Hyoka (Pigment Dispersion Stabilization and Surface Treatment Techniques: Evaluations)", 1st printing, published Dec. 25, 2001, pages 76–85, or by the low-temperature plasma method described in Japanese Kokai Publication Sho-58-217559.

Usable as the carbon black are those carbon black species which generally used in printing inks or resist compositions for black matrices, preferably those carboxyl group-carrying species showing a pH of 7.0 or below. More specifically, one or more of the carbon black species given below by way of example can be used.

Firstly, usable as the carbon black produced by Mitsubishi Chemical are carbon black #2700, #2650, #2600, #2400, #2350, #2200, #1000, #990, #970, MA600, MA77, MA7, MA8, MA11, MA100, MA220, and the like.

Additionally, usable as the carbon black produced by Cabot are MONARCH1400, MONARCH1300, MONARCH1100, MONARCH1000, MOGUL-L, REGAL400R, REGAL350R, and the like.

Further, usable as the carbon black produced by Degussa are ColorBlack Fw200, ColorBlack Fw2, ColorBlack Fw2V, ColorBlack Fw1, ColorBlack Fw18, ColorBlack S170, ColorBlack S160, SpecialBlack6, SpecialBlack5, SpecialBlack4, SpecialBlack4A, SpecialBlack550, SpecialBlack350, SpecialBlack250, SpecialBlack100, Printex150T, PrintexU, PrintexV, Printex140U, Printex140V, and the like. These are all brand names.

In the next place, the carbodiimide compound having one or more carbodiimide groups which is to be used as a compound for treating pigments having a functional group reactive with a carbodiimide group in accordance with the present invention is described.

The carbodiimide compound which can be used in the practice of the invention is one having at least one side chain selected from the group consisting of polyester side chains, polyether side chains and polyacrylic side chains and having a carbodiimide equivalent of 100 to 50,000.

The term "side chain" as used herein means a chain branching off from the main chain, which is the carbodiimide compound proper. When at least one polyester chain and at least one polyether chain are combined in one side chain, the side chain thus formed belongs to both categories of "polyester side chain" and "polyether side chain". When at least one polyester chain and at least one polyacrylic chain are combined in one side chain, the side chain thus formed belongs to both categories of "polyester side chain" and "polyacrylic side chain" and, when at least one polyether chain and at least one polyacrylic chain are combined in one side chain, the side chain thus formed belongs to both categories of "polyether side chain" and "polyacrylic side chain". Further, when at least one polyester chain, at least one polyether chain and at least one polyacrylic chain are combined, the side chain thus formed belongs to all the categories of "polyester side chain", "polyether side chain" and "polyacrylic side chain". Such side chains in which a polyester chain and/or a polyether chain and/or a polyacrylic chain occur in admixture each of course is a side chain satisfying the requirement "having at least one side chain selected from the group consisting of polyester side chains, polyether side chains and polyacrylic side chains".

Most preferably, compounds resulting from intramolecular introduction of at least one side chain selected from the group consisting of polyester groups, polyether groups and polyacrylic groups by utilizing the reaction of the carbodiimide group with a functional group reactive therewith can be utilized as the carbodiimide compound. In the present specification, the reaction between a carbodiimide group and such a functional group is sometimes referred to as "grafting reaction", and the thus-introduced side chain as "grafted side chain". The polyester side chain thus introduced is sometimes referred to as "grafted polyester side chain", the polyether side chain thus introduced as "grafted polyether side chain", and the polyacrylic side chain thus introduced as "grafted polyacrylic side chain".

The term "carbodiimide equivalent" as used herein means the number given by the expression (molecular weight of carbodiimide compound)/(number of carbodiimide groups in each carbodiimide compound molecule).

In the practice of the invention, the carbodiimide compound may comprise either one single species or two or more species.

As the carbodiimide compound having such a grafted side chain(s) as mentioned above, there may first be mentioned compounds derived from compounds having two or more carbodiimide groups in each molecule by addition of at least one side chain selected from the group consisting of polyester side chains, polyether side chains and polyacrylic side chains by the grafting reaction (provided that at least one carbodiimide group should remain).

Utilizable as the compound having two or more carbodiimide groups in each molecule are, for example, compounds obtained by subjecting a diisocyanate compound to decarboxylation for carbodiimide group formation in an organic solvent in the presence of a carbodiimide formation catalyst. As specific examples of the diisocyanate compound to be subjected to decarboxylation, there may be mentioned such aliphatic, alicyclic, aromatic or araliphatic diisocyanate compounds as hexamethylene diisocyanate, isophoronediisocyanate, tolylene diisocyanate, diphenylmethanediisocyanate, cyclohexanediisocyanate, dicyclohexylmethanediisocyanate, xylylene diisocyanate, tetramethylene diisocyanate, and tetramethylxylylene diisocyanate.

A monoisocyanate compound may be used in combination under those conditions which are sufficient for the compound obtained to have two or more carbodiimide groups yet in each molecule. As the monoisocyanate compound which can be utilized on that occasion, there may be mentioned such aliphatic, alicyclic, aromatic or araliphatic monoisocyanate compounds as methyl isocyanate, ethyl isocyanate, propyl isocyanate, butyl isocyanate, octadecyl isocyanate, and phenyl isocyanate.

The organic solvent which is utilizable is one having a high boiling point and having no active hydrogen atom reactive with the isocyanate compound or the carbodiimide group-containing compound formed. Specifically, there may be mentioned, among others, aromatic hydrocarbons, such as toluene, xylene and diethylbenzene; glycol ether esters such as diethylene glycol diacetate, dipropylene glycol dibutyrate, hexylene glycol diacetate, glycol diacetate, methylglycol acetate, ethylglycol acetate, butylglycol acetate, ethyldiglycol acetate and butyldiglycol acetate; ketones such as ethyl butyl ketone, acetophenone, propiophenone, diisobutyl ketone and cyclohexanone; and aliphatic esters such as amyl acetate, propyl propionate and ethyl butyrate.

Utilizable as the carbodiimide formation catalyst are phospholenes, phospholene oxides and so forth. As specific examples, there may be mentioned 1-ethyl-3-methyl-3-phospholene oxide, 1-phenyl-3-methyl-3-phospholene oxide, and 1-phenyl-3-methyl-2-phospholene oxide.

In carrying out the isocyanate group-involving decarboxylation reaction using these materials, use may be made of any of the methods known in the art. Thus, for example, the reaction can be carried out in a nitrogen atmosphere at a reaction temperature of 100 to 200° C. As other methods for obtaining the carbodiimide group-containing compounds mentioned above, there may be mentioned the methods described in U.S. Pat. No. 2,941,956, Japanese Patent Publication Sho-47-33279, Japanese Kokai Publication Hei-05-178954 and Japanese Kokai Publication Hei-06-56950, among others.

Those compounds obtained by using such a method, for example by decarboxylation of K ($\geqq$3) moles of a diisocyanate compound, can be represented by the general formula (1) given below, and those compounds obtained by decarboxylation of (K−1) moles of a diisocyanate compound and 2 moles of monoisocyanate compound can be represented by the general formula (2) given below. These are also referred to as polycarbodiimide compounds.

OCN—(A-N=C=N)$_{K-1}$-A-NCO        (1)

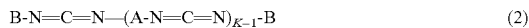

B-N=C=N—(A-N=C=N)$_{K-1}$-B        (2)

In the above general formula, A is the residue derived from the diisocyanate compound used for the synthesis of the polycarbodiimide compounds by removal of the isocyanate groups, and B is the residue derived from the monoisocyanate compound used for the synthesis of the polycarbodiimide compounds by removal of the isocyanate group.

As commercial grades of the carbodiimide group-containing compounds represented by the above general formula (1), there may be mentioned Carbodilite V-03, V-05, etc. (all being brand names, products of Nisshinbo Industries), which are carbodiimides derived from tetramethylxylylene diisocyanate as a starting material.

Such compounds as represented by the general formula (1) have isocyanate groups within the molecule thereof and can also be reacted with a compound having a functional group capable of reacting with the isocyanate group. Thus, they can be used as those compounds having two or more carbodiimide groups within the molecule which are to constitute the carbodiimide compounds of the invention.

Preferred as such compounds having a functional group capable of reacting with the isocyanate group are compounds low in reactivity with the remaining carbodiimide group and capable of selectively reacting first with an isocyanate group, including hydroxyl group-containing compounds, for example low-molecular-weight monoalcohol compounds such as methanol and ethanol, hydroxyl group-containing polyester compounds, polyalkylene glycols and monoalkyl ester compounds derived therefrom, polymethyl methacrylate diol, polybutyl methacrylate diol, poly-2-ethylhexyl methacrylate diol, and like hydroxyl group-containing polyacrylic compounds.

Preferred among them are polyester chains, polyether chains and polyacrylic chains having a formula weight of 500 to 5,000.

A polyester side chain, polyether side chain or polyacrylic side chain is further introduced, by the grafting reaction, into the compounds having two or more carbodiimide groups within the molecule as obtained by using such a method as mentioned above to give carbodiimide compounds containing, within the molecule thereof, at least one carbodiimide group and at least one grafted side chain selected from the group consisting of grafted polyester side chains, grafted polyether side chains and grafted polyacrylic side chains.

Utilizable as a typical method of introducing such side chains into the molecule by the grafting reaction is the method which comprises reacting a polyester compound, polyether compound or polyacrylic compound having a functional group capable of reacting with a carbodiimide group, for example a carboxyl group, sulfonic acid group, phosphoric acid group, hydroxyl group or amino group, with a carbodiimide group of a carbodiimide group-containing compound.

As the functional group-containing polyester compound, there may first be mentioned (1) compounds obtained by ring-opening polymerization of cyclic ester compounds using a hydroxycarboxylic acid, monoalcohol, low-molecular-weight diol compound or the like as an initiator (e.g. polyester compounds having a carboxyl group and a hydroxyl group as obtained by ring-opening polymerization of cyclic ester compounds such as ε-caprolactone, γ-butyrolactone, 2-methylcaprolactone, 4-methylcaprolactone, β-propiolactone, δ-valerolactone and β-methyl-δ-valerolactone using, as an initiator, a mono- or polyhydroxycarboxylic acid such as lactic acid, caproic acid, 12-hydroxystearic acid, dimethylolpropionic acid or dimethylolbutanoic acid; hydroxyl group-containing polyester monool compounds obtained by ring-opening polymerization of the cyclic ester compounds mentioned above using, as an initiator, a low-molecular-weight monool compound such as methanol or ethanol; hydroxyl group-containing polyester diol compounds obtained by ring-opening polymerization of the cyclic ester compounds mentioned above using, as an initiator, a low-molecular-weight diol compound such as ethylene glycol or propylene glycol).

Further, there may be mentioned (2) compounds obtained by self-polycondensation of hydroxycarboxylic acids (e.g. polyester compounds containing a carboxyl group and a hydroxyl group as obtained by polycondensation of monohydroxycarboxylic acids such as lactic acid, caproic acid and 12-hydroxystearic acid).

There may further be mentioned (3) compounds obtained by polycondensation of low-molecular-weight diol compounds and low-molecular-weight dicarboxylic acid compounds (e.g. hydroxyl group-containing polyester diol compounds obtained by reacting a low-molecular-weight diol compound component, for example a linear glycol such as ethylene glycol, 1,3-propanediol, 1,4-butanediol or 1,6-hexanediol or a branched glycol such as 1,2-propanediol, neopentyl glycol, 3-methyl-1,5-pentanediol or ethylbutylpropanediol, with a low-molecular-weight dicarboxylic acid component, for example a saturated or unsaturated aliphatic dicarboxylic acid such as succinic acid, adipic acid, azelaic acid, sebacic acid or maleic acid or an aromatic dicarboxylic acid such as phthalic acid in the presence of an excess of the low-molecular-weight diol compound).

There may also be mentioned (4) phosphate ester compounds derived from products of ring-opening polymerization of cyclic ester compounds using a monoalcohol as an initiator (e.g. phosphoric acid group-containing polyester diol compounds obtained by esterification of the polyester monool compounds mentioned above with phosphoric acid), and (5) compounds obtained by ring-opening polymerization of cyclic ester compounds using an amino group-containing sulfonic acid compound as an initiator (e.g. sulfonic acid group-containing polyester diol compounds obtained by ring-opening polymerization of the cyclic ester compounds using taurine or a like amino group-containing sulfonic acid compound as an initiator).

There may further be mentioned (6) sulfurous acid gas adducts derived from products of ring-opening polymerization of cyclic ester compounds using a monoalcohol as an initiator (e.g. sulfonic acid group-containing polyester diol compounds obtained by addition of sulfurous acid gas to the above-mentioned polyester monool compounds).

Among such polyester compounds, those polyester compounds obtained by ring-opening polymerization of polycaprolactone are preferred.

As the functional group-containing polyether compound, there may first be mentioned (1) compounds obtained by ring-opening polymerization of cyclic ether compounds using a hydroxycarboxylic acid, monoalcohol, low-molecular-weight diol compound or the like as an initiator (e.g. polyether compounds having a carboxyl group and a hydroxyl group as obtained by ring-opening polymerization of cyclic ether compounds such as ethylene oxide, propylene oxide, trimethylene oxide, tetrahydrofuran and tetrahydropyran using, as an initiator, a mono- or polyhydroxycarboxylic acid such as lactic acid, caproic acid, 12-hydroxystearic acid, dimethylolpropionic acid or dimethylolbutanoic acid; hydroxyl group-containing polyether monool compounds obtained by ring-opening polymerization of the cyclic ether compounds mentioned above using, as an initiator, a low-molecular-weight monool compound such as methanol or ethanol; hydroxyl group-containing polyether diol compounds obtained by ring-opening polymerization of the cyclic ether compounds mentioned above using, as an initiator, a low-molecular-weight diol compound such as ethylene glycol or propylene glycol).

There may also be mentioned (2) phosphate ester compounds derived from products of ring-opening polymerization of cyclic ether compounds using a monoalcohol as an initiator (e.g. phosphoric acid group-containing polyether compounds obtained by esterification of the polyether monool compounds mentioned above with phosphoric acid).

Further, there may be mentioned (3) compounds obtained by ring-opening polymerization of cyclic ether compounds using an amino group-containing sulfonic acid compound as an initiator (e.g. sulfonic acid group-containing polyether compounds obtained by ring-opening polymerization of the cyclic ether compounds using taurine or a like amino group-containing sulfonic acid compound as an initiator).

There may further be mentioned (4) sulfurous acid gas adducts derived from products of ring-opening polymerization of cyclic ether compounds using a monoalcohol as an initiator (e.g. sulfonic acid group-containing polyether compounds obtained by addition of sulfurous acid gas to the above-mentioned polyether monool compounds).

As the above-mentioned functional group-containing polyacrylic compound, there may be mentioned (meth) acrylic polymers obtained by polymerization of a monomer composition comprising at least one monomer selected from among (meth)acrylic monomers having at least one group selected from the group consisting of a carboxyl group, sulfonic acid group, phosphoric acid group, hydroxyl group and amino group (e.g. (meth)acrylic polymers obtained by polymerization of at least one monomer component selected from among such monomers as carboxyl group-containing (meth)acrylic monomers: (meth)acrylic acid, crotonic acid, maleic acid, fumaric acid, citraconic acid (methylmaleic acid), itaconic acid, etc.; sulfonic acid group-containing (meth)acrylic monomers: sulfoethyl (meth)acrylate, sulfopropyl (meth)acrylate, etc.; phosphoric acid group-containing (meth)acrylic monomers: 2-methacryloyloxyethyl acid phosphate, tris(acryloyloxyethyl) phosphate, etc.; hydroxyl group-containing (meth)acrylic monomers: (meth)acrylic acid hydroxyalkyl esters such as 2-hydroxyethyl (meth) acrylate, hydroxypropyl (meth)acrylate and hydroxypentyl (meth)acrylate; amino group-containing (meth)acrylic monomers: (meth)acrylamide, N-methyl(meth)acrylamide, N-ethyl(meth)acrylamide, N-propyl(meth)acrylamide, N-butyl(meth)acrylamide, N-hexyl(meth)acrylamide, N-octyl(meth)acrylamide, etc., if necessary together with one or more of known monomers (other than the above-mentioned monomers) generally used as reactant components of acrylic resins, for example alkyl esters and styrenic monomers.

Furthermore, those compounds which have the functional group defined above and contains both a polyester chain and a polyether chain, those polyacrylic compounds which have the functional group defined above and a polyester chain, and those polyacrylic compounds which have the functional group defined above and a polyether chain may also be used. Thus, usable are, for example, compounds obtained by reacting cyclic ester compounds with a polyalkylene glycol or a monoalkyl ether compound derived therefrom, which is used as an initiator, compounds obtained by reacting hydroxyl group-containing polyester compounds with a cyclic ether compound, and polyacrylic chain compounds obtained by using (meth)acrylic monomers containing a polyester chain within the molecule or (meth)acrylic monomers containing a polyether chain within the molecule.

Those polyester compounds, polyether compounds and polyacrylic compounds which contain a carboxyl group, sulfonic acid group or phosphoric acid group are advantageous from the viewpoint of reactivity with a carbodiimide group.

In cases where the polycarbodiimide compound to serve as a basis further has at least one isocyanate group, the hydroxyl group-containing compounds react with the isocyanate group earlier than with the carbodiimide group(s), whereby it becomes difficult to control the reaction. Furthermore, those compounds having two or more hydroxyl groups may possibly cause gelation as a result of crosslinking during a grafting reaction.

Therefore, with those compounds which contain hydroxyl groups alone as the functional groups, it is desirable that they be further reacted with an acid anhydride such as phthalic anhydride, maleic anhydride or succinic anhydride to give polyester compounds having one carboxyl group and such polyester compounds be subjected to grafting reaction.

The compounds resulting from intramolecular introduction of at least one of the polyester compounds, polyether compounds or polyacrylic compounds enumerated hereinabove are further required to have at least one carbodiimide group. For example, when a side chain is introduced, by grafting reaction, into a polycarbodiimide compound represented by the general formula (1) given hereinabove, a carbodiimide compound represented by the following general formula (3) is obtained (provided that K−1=m+n).

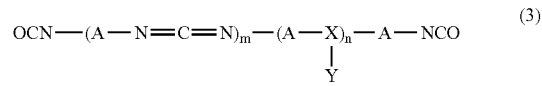

(3)

In the above formula, A is the residue derived from the diisocyanate compound used in synthesizing the polycarbodiimide compound by removal of isocyanate groups. X's are the same or different and each is a trivalent linking group resulting from the reaction of the carbodiimide group with a functional group reactive therewith, Y's are the same or different and each is a polyester chain, polyether chain or polyacrylic chain, and m and n each represents an integer of not smaller than 1.

As for the trivalent linking group represented by X in the above formula, for instance, the linking group formed by the reaction between a carbodiimide group and a carboxyl group is represented by the general formula (4) or (5) given below, the linking group formed by the reaction between a carbodiimide group and a hydroxyl group by the general formula (6) or (7) given below, the linking group formed by the reaction between a carbodiimide group and an amino group by the general formula (8) given below, the linking group formed by the reaction between a carbodiimide group and a sulfonic acid group by the general formula (9) given below, and the linking group formed by the reaction between a carbodiimide group and a phosphoric acid group by the general formula (10) given below.

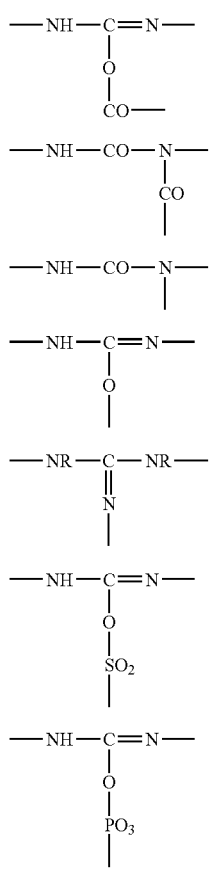

In the above general formulas, R represents a hydrogen atom or a hydrocarbon group containing at least one carbon atoms.

Furthermore, it is also possible to react the carbodiimide compound represented by the general formula (3), which has isocyanate groups within the molecule, with a compound having a functional group capable of reacting with an isocyanate group. Thus, compounds represented by the general formula (11) given below can also be utilized as the carbodiimide compound in the practice of the invention.

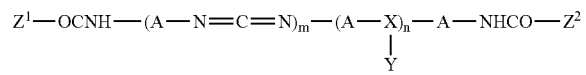

In the above general formula, $Z^1$ and $Z^2$ each independently represents the residue resulting from removal of one active hydrogen atom from the functional group of the isocyanate group-reactive functional group-containing compound, which may be different in structure. A is the residue resulting from removal of isocyanate groups from the diisocyanate compound used for the synthesis of the polycarbodiimide compound. X's are the same or different and each is a trivalent linking group resulting from the reaction of the carbodiimide group with the functional group reactive therewith, Y's are the same or different and each is a polyester chain, polyether chain or polyacrylic chain, and m and n each represents an integer of not smaller than 1.

Preferred as such isocyanate group-reactive functional group-containing compound are compounds low in reactivity with the remaining carbodiimide group and selectively reacting first with an isocyanate group, including, among others, low-molecular-weight monoalcohol compounds such as methanol and ethanol, hydroxyl group-containing polyester compounds, polyalkylene glycols and monoalkyl ester compounds derived therefrom, hydroxyl group-containing polyacrylic compounds such as polymethyl methacrylate diol, polybutyl methacrylate diol and poly-2-ethylhexyl methacrylate diol, and like hydroxyl group-containing compounds.

Preferred among them are ones forming a polyester chain, polyether chain or polyacrylic chain with a formula weight of 500 to 5,000.

In carrying out the reactions mentioned above, namely the above-mentioned ring-opening reaction of cyclic ester compounds using a hydroxyl group-containing compound as an initiator, polycondensation reaction of hydroxycarboxylic acids, polycondensation reaction of low-molecular-weight diol compounds with low-molecular-weight dicarboxylic acid compounds, ring-opening reaction of hydroxyl group-containing ester compounds with acid anhydrides, ring-opening reaction of cyclic ether compounds, ring-opening reaction of hydroxyl group-containing ether compounds with acid anhydrides, reaction of a carbodiimide group with a carboxyl or hydroxyl group and, further, reaction of an isocyanate group with a hydroxyl group, among others, the conventional methods can be utilized.

The above-mentioned carbodiimide compound may be any of those compounds having at least one carbodiimide group and at least one of grafted polyester chain, grafted polyether chain and grafted polyacrylic chain. Even when the order of reactions of the respective reactants is changed, the compound finally obtained has the same molecular structure, the performance characteristics obtainable do not differ.

Therefore, referring to the compounds of the above general formula (11), the method of intramolecular side chain introduction which comprises reacting (a compound containing) at least one chain selected from the group consisting of polyester chains, polyether chains and polyacrylic chains each having a functional group reactive with a carbodiimide group with a carbodiimide group (-containing compound), namely the method which comprises first synthesizing a carbodiimide group-reactive functional group-containing polyester compound, carbodiimide group-reactive functional group-containing polyether compound, or carbodiimide group-reactive functional group-containing polyacrylic compound and then reacting this with a carbodiimide group for the introduction of a grafted polyester chain, grafted polyether chain or grafted polyacrylic chain, has been described hereinabove. According to an alternative method of introducing such a side chain into the molecule of a carbodiimide compound by a grafting reaction, a carbodiimide group-reactive functional group-containing compound is reacted with a carbodiimide group (-containing compound), followed by intramolecular introduction of a compound capable of forming at least one chain selected from the group consisting of polyester chains, polyether chains and polyacrylic chains.

In the case of introduction of a grafted polyester side chain or grafted polyether side chain, for instance, use may be made of the method which comprises first reacting a hydroxycarboxylic acid with a carbodiimide group for intramolecular introduction of a hydroxyl group into the carbodiimide compound and then subjecting a cyclic polyester compound or cyclic polyether compound to ring-opening polymerization for graft bonding of a polyester chain or polyether chain. In the case of introduction of a grafted polyacrylic chain, use may be made of the method which comprises first reacting a hydroxycarboxylic acid with a carbodiimide group for intramolecular introduction of a hydroxyl group into the carbodiimide compound and then carrying out graft bonding of a polyacrylic chain.

Furthermore, an isocyanate group remaining in the molecule of a carbodiimide group-containing compound may be first reacted with such a reactive functional group as mentioned above, followed by grafting. As for the order of these reactions, it is desirable that the synthesis be carried out under conditions such that the formation of unfavorable side reaction products may be minimized.

As another example of the carbodiimide compound having a grafted polyester chain, grafted polyether chain or grafted polyacrylic chain within the molecule, there may be mentioned the compound obtained by the method described below from a compound represented by the above general formula (1) and a compound represented by the general formula (12) given below as derived by introduction of a grafted polyester chain, grafted polyether chain or grafted polyacrylic chain into each carbodiimide group.

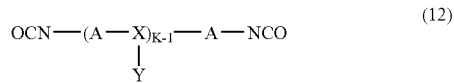

(12)

In the above general formula, X, Y, A and K are respectively as defined above.

First, one of the compounds of general formula (1) or of general formula (12) is used, and the isocyanate groups on both ends are reacted with a diol compound to give a compound having a hydroxyl group at each terminus. For example, the compound obtained by reacting 1 mole of a compound of general formula (1) with 2 moles of a diol compound is represented by the general formula (13) given below, while the compound obtained by reacting 1 mole of a compound of general formula (12) with 2 moles of a diol compound is represented by the general formula (14) given below.

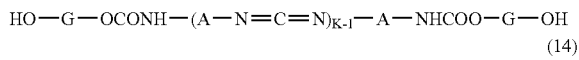

(13)

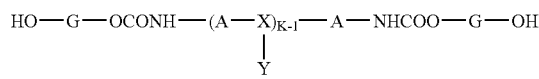

(14)

In the above general formulas, G represents the diol compound residue resulting from removal of the hydroxyl group that has reacted with an isocyanate group.

And, those compounds obtained by reacting the above-mentioned carbodiimide group-containing diol compound (compound represented by the general formula (13)) with a diisocyanate compound having a grafted polyester chain, grafted polyether chain or grafted polyacrylic chain (compound represented by the general formula (12)) or, conversely, reacting a diol compound having such a graft side chain (compound represented by the general formula (14)) with a carbodiimide group-containing diisocyanate compound (compound represented by the general formula (1)) can be utilized in the practice of the invention.

Furthermore, it is also possible to obtain carbodiimide compounds having such a side chain from other combinations, for example by utilizing monocarbodiimide compounds or compounds derived from monocarbodiimide compounds by introduction of a grafted polyester chain, grafted polyether chain or grafted polyacrylic chain as substitutes for the polycarbodiimide compounds or components to be used in combination.

Utilizable further as the method of side chain introduction into carbodiimide compounds other than the method involving a grafting reaction is, for example, the method which comprises subjecting a polycarbodiimide compound represented by the general formula (1) to chain extension using a chain extender having a polyester chain, polyether chain or polyacrylic chain.

Such chain extenders include, among others, such polyester chain-containing ones as compounds obtained by ring-opening polymerization of the above-mentioned cyclic polyester compound on a polyol compound having three or more hydroxyl groups, for example trimethylolpropane or pentaerythritol, compounds obtained by polycdndensation of the above-mentioned low-molecular-weight dicarboxylic acid and the above-mentioned low-molecular-weight diol compound partly in combination with a triol compound, and compounds obtained by reacting a diol monocarboxylic acid, such as dimethylolpropionic acid, with an epoxy compound having a polyester chain within the molecule. As polyether chain-containing ones, there may be mentioned, among others, compounds obtained by ring-opening polymerization of the above-mentioned cyclic polyether compound on the above-mentioned polyol compound. As polyacrylic chain-containing ones, there may be mentioned, among others, compounds obtained by reacting the above-mentioned polyol compound with a carboxyl group-containing (meth)acrylic polymer.

The carbodiimide compounds enumerated above are compounds suited for use in treating carbodiimide group-reactive organic pigments and carbon black for pigment dispersion.

Thus, those compounds for treating carbodiimide group-reactive functional group-containing organic pigments or carbon black which are carbodiimide compounds having, within the molecule, at least one side chain selected from the group consisting of polyester side chains, polyether side chains and polyacrylic side chains and have a carbodiimide equivalent of 100 to 50,000 also constitute an aspect of the present invention.

In the above-mentioned carbodiimide compounds, the polyester chain, polyether chain or polyacrylic chain to be introduced as a side chain is not particularly restricted but may be any of those which are effective in improving the dispersion stability of pigments in a dispersion medium. Preferably, it has a formula weight of not less than 200 but not more than 10,000, more preferably not less than 300 but not more than 5,000.

The above carbodiimide compounds have a carbodiimide equivalent of 100 to 50,000, preferably not less than 200 but not more than 10,000. If the carbodiimide equivalent is excessively high, the dispersion stability of the carbodiimide group-reactive functional group-containing pigments in a dispersion medium may decrease. In cases where carbon black is used as the pigment, the black matrix coatings finally produced will unfavorably show deteriorated insulating properties. On the other hand, when the carbodiimide equivalent is excessively low, the carbodiimide group content becomes excessive, possibly causing a decrease in the dispersion stability of the carbodiimide group-reactive functional group-containing pigments in a dispersion medium as well. In cases where carbon black is used as the pigment, a problem arises, namely the pigment dispersion-based resist composition prepared using the same reacts with the film-forming resin used, causing viscosity increases and gelation.

The carbodiimide compound to be used in the practice of the invention preferably has a number average molecular weight of not less than 1,000 but not more than 100,000, more preferably not less than 1,000 but not more than 50,000. When the number average molecular weight of the carbodiimide compound is excessively high, it becomes difficult for dispersions prepared by dispersing a carbodiimide group-reactive functional group-containing pigment in a dispersion medium and pigment dispersion-based resist compositions prepared therefrom to have an appropriate level of viscosity, and this is unfavorable in particular when a high-concentration pigment dispersion composition is required. On the other hand, when the number average molecular weight is excessively low, the dispersion stability of the above-mentioned pigments in a dispersion medium unfavorably decreases and, in particular when carbon black is used as the pigment, the black matrix coatings finally produced unfavorably show deteriorated insulating properties.

Therefore, the number of carbodiimide groups intramolecularly occurring in the carbodiimide compound and the proportion thereof relative to the side chain such as a polyester chain, polyether chain or polyacrylic chain should preferably be adjusted in an appropriate manner principally according to the amount of the carbodiimide group-reactive functional group occurring on the pigment surface and the performance characteristics required in the intended field of application.

The compounds represented by the general formula (3) or (11) are advantageous in that they can be obtained under relatively simple and unsophisticated synthesis conditions. However, when one polyester chain, polyether chain or polyacrylic chain is subjected to grafting, by the grafting reaction, onto a compound having a small number of carbodiimide groups, for example a carbodiimide compound having two carbodiimide groups in each molecule, a byproduct having no grafted side chain within the molecule (containing two carbodiimide groups) and a byproduct having two grafted side chains within the molecule (containing no carbodiimide group) are both formed according to the probabilities of the respective reactions.

If the compound having two grafted side chains within the molecule is formed abundantly in such a case, it becomes difficult to achieve the effects of the present invention. Therefore, it is desirable, for example, that the carbodiimide compound for use in the treatment of the above-mentioned pigments be synthesized under conditions such that the grafted side chain can be obtained in an average proportion of about 0.7 per molecule, to thereby cause abundant formation of a mixture of the compound containing one such grafted side chain within the molecule and the compound containing no grafted side chain.

On the other hand, those compounds obtained by reacting a compound represented by the general formula (14) with a compound represented by the general formula (13) and those compounds obtained by reacting a compound represented by the general formula (1) with a chain extender having a polyester chain, polyether chain or polyacrylic chain as a side chain, among others, are advantageous in that they are obtained as carbodiimide compounds having at least one such side chain and at least one carbodiimide group within the molecule. For the synthesis thereof, however, it is necessary to establish sufficient synthesis conditions, for example the temperature for the reaction between the isocyanate group and hydroxyl group, in advance.

Now, the method of treating the above-mentioned pigments using the carbodiimide compound specified herein is described.

The treatment, so referred to herein, comprises treating the whole or part of the surface of dispersed particles of any of the pigments mentioned above using the carbodiimide compound. More specifically, there may be mentioned the method which comprises kneading or milling, for dispersion/treatment, a mixture composed of the above-mentioned pigment and side chain-containing carbodiimide compound, if necessary together with a dispersion medium and another or other additives and so forth, using a roll mill, kneader, high-speed stirrer, bead mill, ball mill, sand mill, ultrasonic dispersing apparatus or high-pressure dispersing apparatus, for instance.

In the practice of the invention, the treatment is preferably carried out so that the carbodiimide group(s) occurring within the molecule of the carbodiimide compound may react with the functional group, such as a carboxyl group, sulfonic acid group or hydroxyl group, occurring on the pigment surface to acquire strong adsorptivity.

In carrying out the above pigment treatment using the side chain-containing carbodiimide compound alone without using any dispersion medium, the mixture is preferably warmed to a temperature which is not lower than the melting point of the carbodiimide compound and at which the reaction of the carbodiimide group and the functional group occurring on the pigment surface can be promoted. The reaction-promoting temperature mentioned above is generally not higher than 100° C., preferably about 40 to 80° C. The treated pigment obtained by such method can be roughly ground or made into a chip-like form for later utilization following dispersion in an appropriate dispersion medium in an arbitrary field of application.

On the other hand, when the treatment is carried out in an organic dispersion medium or aqueous dispersion medium capable of dissolving the carbodiimide compound to be used in the practice of the invention and stably dispersing the pigment in question while dispersing the pigment in that medium, the treatment is preferably carried out with warming to a temperature at which the reaction mentioned above can be promoted, although the treatment can be carried out at relatively low temperatures. In cases where the treatment is carried out while finely dispersing the above pigment in a dispersion medium which is adequately used in the field of inks or paints, the treatment product as such can be used as a pigment dispersion in preparing inks or paints.

As examples of the dispersion medium adequately utilized in the field of inks or paints, there may be mentioned, among organic dispersion media, (poly)alkylene glycol monoalkyl ethers such as ethylene glycol monomethyl ether, ethylene glycol monoethyl ether, diethylene glycol monomethyl ether, diethylene glycol monoethyl ether, propylene glycol monomethyl ether and propylene glycol monoethyl ether; (poly)alkylene glycol monoalkyl ether acetates such as ethylene glycol monomethyl ether acetate, ethylene glycol monoethyl ether acetate and propylene glycol monomethyl ether acetate; ethers such as diethylene glycol diethyl ether, diethylene glycol methyl ethyl ether and tetrahydrofuran; ketones such as methyl ethyl ketone, methyl isobutyl ketone, cyclohexanone, 2-heptanone and 3-heptanone; lactic acid alkyl esters such as methyl 2-hydroxypropionate and ethyl 2-hydroxypropionate; esters such as ethyl 2-hydroxy-2-methylpropionate, 3-methyl-3-methoxybutyl propionate, methyl 3-methoxypropionate, ethyl 3-ethoxypropionate, ethyl ethoxyacetate, ethyl hydroxyacetate, ethyl acetate, n-butyl acetate, isobutyl acetate, n-butyl propionate, methyl acetoacetate, n-amyl formate and ethyl pyruvate; aromatic hydrocarbons such as toluene and xylene; amides such as N-methylpyrrolidone, N,N-dimethylformamide and N,N-dimethylacetamide; and alcohols such as isopropyl alcohol and normalpropyl alcohol. These dispersion media may be used singly or as a mixture of two or more of them.

The aqueous medium may consist of water alone or a combination of water and a water-miscible organic dispersion medium.

Further, the proportion of the carbodiimide compound for the above pigment treatment is preferably not less than 3 parts by mass but not more than 100 parts by mass, more preferably not less than 5 parts by mass but not more than 50 parts by mass, relative to 100 parts by mass of the pigment (or the sum of the pigments used). Preferably, that proportion is adjusted according, among others, to the amount of the carbodiimide group-reactive functional group occurring on the pigment surface and to the required performance characteristics, such as dispersion performance, fluidity, insulating properties, etc.

The treated pigments thus obtained are suitably utilized in the fields of inks, paints, pigment dispersion-based resist compositions for black matrices, pigment dispersion-based resist compositions for color filters, inks for ink jet inks for writing materials, ribbon inks, liquid developers and so forth, if necessary after supplementation with one or more of various binder resins, solvents, surfactants and other additives.

The pigment dispersion-based resist composition for black matrices and color filters as a preferred example of the use of the treated pigment according to the invention is now described in further detail.

The pigment dispersion-based resist composition is a resist composition which can be cured upon irradiation with actinic rays and can be developed with an alkali. It is mainly composed of the treated pigment of the invention (treated carbon black or treated organic pigment), a film-forming resin, a photopolymerizable compound, a photopolymerization initiator and a solvent, if necessary together with one or more appropriate additives, for example a polymerization inhibitor.

As for the treated carbon black constituting the pigment dispersion-based resist composition for black matrices according to the invention, one which, once dispersed, hardly form aggregates is preferably used so that highly insulating films may be formed.

As for the treated carbon black constituting the pigment dispersion-based resist composition for black matrices, a carbon black species whose mean primary particle size is small and not greater than 0.15 μm is preferred. When such a carbon black species is dispersed, the hue is preferably adjusted to neutral black by adding a complementary color pigment as necessary.

As for the carbodiimide group-reactive functional group-containing organic pigment for obtaining the treated organic pigment which constitutes the pigment dispersion-based resist composition for color filters, a carbodiimide group-reactive function group-containing organic pigment of high grade is preferably utilized for forming coatings having a vivid hue.

The film-forming resins for constituting the pigment dispersion-based resist composition of the invention include, among others, carboxyl group-containing, alkali-soluble copolymer resins obtained by reacting a carboxyl group-containing unsaturated monomer, such as acrylic acid, methacrylic acid, itaconic acid, maleic acid, maleic anhydride, a maleic acid monoalkyl ester, citraconic acid, citraconic anhydride, a citraconic acid monoalkyl ester, with at least one monomer selected from the group consisting of styrene, 2-hydroxyethyl acrylate, 2-hydroxyethyl methacrylate, allyl acrylate, allyl methacrylate, benzyl acrylate, benzyl methacrylate, glycerol monoacrylate, glycerol methacrylate, N-phenylmaleimide, polystyrene macromonomers and polymethyl methacrylate macromonomers. They can be used singly or as a mixture of two or more of them.

The photopolymerizable compound which constitutes the pigment dispersion-based resist composition of the invention is a monomer or oligomer having a photopolymerizable unsaturated bond(s).

As example of the monomer having one photopolymerizable unsaturated bond within the molecule, there may be mentioned alkyl methacrylates or acrylates such as methyl methacrylate, butyl methacrylate, 2-ethylhexyl methacrylate, methyl acrylate, butyl acrylate and 2-ethylhexyl acrylate; aralkyl methacrylates or acrylates such as benzyl methacrylate and benzyl acrylate; alkoxyalkyl methacrylates or acrylates such as butoxyethyl methacrylate and butoxyethyl acrylate; aminoalkyl methacrylates or acrylates such as N,N-dimethylaminoethyl methacrylate and N,N-dimethylaminoethyl acrylate; methacrylic acid esters or acrylic acid esters of polyalkylene glycol monoalkyl ethers such as diethylene glycol monoethyl ether, triethylene glycol monobutyl ether and dipropylene glycol monomethyl ether; methacrylic acid esters or acrylic acid esters of polyalkylene glycol monoaryl ethers such as hexaethylene glycol monophenyl ether; isobornyl methacrylate or acrylate; glycerol methacrylates or acrylates; 2-hydroxyethyl methacrylate or acrylate, etc.

As example of the monomer having two or more photopolymerizable unsaturated bonds within the molecule, there may be mentioned, among others, bisphenol A dimethacrylate, 1,4-butanediol dimethacrylate, 1,3-butylene glycol dimethacrylate, diethylene glycol dimethacrylate, glycerol dimethacrylate, neopentyl glycol dimethacrylate, polyethylene glycol dimethacrylate, polypropylene glycol dimethacrylate, tetraethylene glycol dimethacrylate, trimethylolpropane trimethacrylate, pentaerythritol trimethacrylate, pentaerythritol tetramethacrylate, dipentaerythritol tetramethacrylate, dipentaerythritol hexamethacrylate, dipentaerythritol pentamethacrylate, bisphenol A diacrylate, 1,4-butanediol diacrylate, 1,3-butylene glycol diacrylate, diethylene glycol diacrylate, glycerol diacrylate, neopentyl glycol diacrylate, polyethylene glycol diacrylate, polypropylene glycol diacrylate, tetraethylene glycol diacrylate, trimethylolpropane triacrylate, pentaerythritol triacrylate, pentaerythritol tetraacrylate, dipentaerythritol tetraacrylate, dipentaerythritol hexaacrylate, dipentaerythritol pentaacrylate, etc. These photopolymerizable compounds can be used singly or in combination of two or more of them.

The photopolymerization initiators which constitute the pigment dispersion-based resist composition of the invention are not particularly restricted but include, among others, benzophenone, N,N'-tetraethyl-4,4'-diaminobenzophenone, 4-methoxy-4'-dimethylaminobenzophenone, benzil, 2,2-diethoxyacetophenone, benzoin, benzoin methyl ether, benzoin isobutyl ether, benzil dimethyl ketal, α-hydroxyisobutyrophenone, thioxanthone, 2-chlorothioxanthone, 1-hydroxycyclohexyl phenyl ketone, tert-butylanthraquinone, 1-chloroanthraquinone, 2,3-dichloroanthraquinone, 3-chloro-2-methylanthraquinone, 2-ethylanthraquinone, 1,4-naphthoquinone, 1,2-benzanthraquinone, 1,4-dimethylanthraquinone, 2-phenylanthraquinone, and triazine type photopolymerization initiators. These photopolymerization initiators are used singly or in combination of two or more of them.

The solvent which constitutes the pigment dispersion-based resist composition of the invention may be the same as the dispersion medium mentioned hereinabove and preferably is one having a boiling point of 100 to 220° C. at atmospheric pressure ($1.013 \times 10^2$ kPa) as selected from among ester type organic solvents, ether type organic solvents, ether ester type organic solvents, ketone type organic solvents, aromatic hydrocarbon solvents and nitrogen-containing organic solvents, among others.

As specific examples of such organic solvents, there may be mentioned ether type organic solvents such as ethylene glycol monomethyl ether, ethylene glycol monoethyl ether, ethylene glycol monoisopropyl ether, ethylene glycol monobutyl ether, diethylene glycol monomethyl ether, diethylene glycol monoethyl et her, propylene glycol monomethyl ether, propylene glycol monoethyl ether, propylene glycol monobutyl ether, diethylene glycol diethyl ether, diethylene glycol dimethyl ether and diethylene glycol methyl ethyl ether; ether ester type organic solvents such as ethylene glycol monomethyl ether acetate, ethylene glycol monoethyl ether acetate, ethylene glycol monobutyl ether acetate, propylene glycol monomethyl ether acetate and propylene glycol monoethyl ether acetate; ketone type organic solvents such as methyl isobutyl ketone, cyclohexanone, 2-heptanone and δ-butyrolactone; ester type organic solvents such as methyl 2-hydroxypropionate, ethyl 2-hydroxypropionate, ethyl 2-hydroxy-2-methylpropionate, 3-methyl-3-methoxybutyl propionate, methyl 3-methoxypropionate, ethyl 3-methoxypropionate, methyl 3-ethoxypropionate, ethyl 3-ethoxypropionate, ethyl ethoxyacetate, ethyl hydroxyacetate and n-amyl formate; nitrogen-containing organic solvents such as N-methylpyrrolidone, N,N-dimethylformamide and N,N-dimethylacetamide; and so forth. These may be used singly or as a mixture of two or more of them.

Preferred among these organic solvents from the solubility, dispersibility and/or applicability viewpoint, among others, are diethylene glycol dimethyl ether, diethylene glycol methyl ethyl ether, ethylene glycol monomethyl ether acetate, propylene glycol monomethyl ether acetate, propylene glycol monoethyl ether acetate, cyclohexanone, 2-heptanone, ethyl 2-hydroxypropionate, 3-methyl-3-methoxybutyl propionate, ethyl 3-methoxypropionate, methyl 3-ethoxypropionate, n-amyl formate and the like. Propylene glycol monomethyl ether acetate is more preferred.

Further, from the viewpoint of the solubility of the alkali-soluble resin, the dispersibility of the pigment and/or the applicability, among others, such organic solvents are preferably used in an amount of not less than 50% by mass, more preferably not less than 70% by mass, relative to the whole amount of the organic solvents used in the pigment dispersion-based resist composition of the invention.

When the content of an organic solvent(s) having a boiling point of 220° C. or above is high, the organic solvent may not be fully evaporated but partly remain in the dried coatings on the occasion of prebaking the coatings applied and formed, hence the heat resistance of the dried coatings may be deteriorated. When the content of an organic solvent(s) with a boiling point below 100° C. is high, it becomes difficult to apply the composition evenly and uniformly and, accordingly, it may become impossible to obtain coatings excellent in surface smoothness.

Furthermore, the pigment dispersion-based resist composition of the invention may contain, according to need, one or more of various additives such as other photopolymerizable compounds, thermal polymerization inhibitors, ultraviolet absorbers and antioxidants, each in an appropriate amount.

A method of producing the pigment dispersion-based resist composition of the invention using the materials mentioned above is now described.

The method of producing the pigment dispersion-based resist composition of the invention is an example of the mode of embodiment of the present invention and is by no means limitative of the scope of the present invention.

In producing the pigment dispersion-based resist composition of the invention from the constituent materials described above, use may be made of the method which comprises adding the above-mentioned photopolymerizable compound, photopolymerization initiator and film-forming resin, if necessary together with an organic solvent and another additive or other additives, to the pigment dispersion composition prepared by dispersing the treated pigment by the method described above, and mixing them together using a high-speed stirring apparatus, high-pressure emulsifying apparatus, bead mill, three-roll mill, sand mill or kneader, for instance.

The pigment dispersion composition of the invention has good dispersion stability and fluidity even at high pigment content levels and, when carbon black is used as the pigment, the coatings formed therefrom show great hiding power and good insulating properties even when they are thin films and, when a carbodiimide group-reactive functional group-containing organic pigment is used as the pigment, the coatings have high permeability and high contrast. Therefore, for example, the pigment dispersion composition of the invention can be adequately used as a material for producing black matrices which are required to have high insulating properties and in a pigment dispersion-based resist composition for color filters which are required to have high permeability and high contrast.

BEST MODE FOR CARRYING OUT THE INVENTION

The following examples illustrate the present invention more specifically. They are, however, by no means limitative of the scope of the invention. In the following examples, "part(s)" denotes "part(s) by mass", unless otherwise specified.

[Preparation of Carbodiimide Compounds for Use as Compounds for Pigment Treatment]

<a. Preparation of Polyester Side Chain-Containing Carbodiimide Compounds etc.>

PREPARATION EXAMPLE a-1

A four-necked flask equipped with a reflux condenser, nitrogen gas inlet tube, stirring rod and thermometer was charged with 50.0 parts of an isocyanate group-containing polycarbodiimide compound with a carbodiimide equivalent of 31.6 and 115.7 parts of poly(3-methylpentyl adipate) diol with a molecular weight of 1,000, the mixture was maintained at about 100° C. for 5 hours to allow the isocyanate group to react with the hydroxyl group, 84.6 parts of a carboxyl group-terminated polycaprolactone ring-opening polymerization product with a molecular weight of 2,000 was then added, and the whole mixture was maintained at about 100° C. for 2 hours to allow the carbodiimide group to react with the carboxyl group. Thereafter, 375.5 parts of propylene glycol monomethyl ether acetate was added. A carbodiimide compound (a-1) with a number average molecular weight of about 4,200 and a carbodiimide equivalent of 2,053 was thus obtained.

PREPARATION EXAMPLE a-2

A carbodiimide compound (a-2) with a number average molecular weight of about 4,200 and a carbodiimide equivalent of 2,053 was obtained in the same manner as in Preparation Example (a-1) except that polypropylene glycol with a molecular weight of 1,000 was used in lieu of the poly(3-methylpentyl adipate) diol with a molecular weight of 1,000.

PREPARATION EXAMPLE a-3

A carbodiimide compound (a-3) with a number average molecular weight of about 4,200 and a carbodiimide equivalent of 2,053 was obtained in the same manner as in Preparation Example (a-1) except that polybutyl methacrylate diol with a molecular weight of 1,000 was used in lieu of the poly(3-methylpentyl adipate) diol with a molecular weight of 1,000.

PREPARATION EXAMPLE a-4

A carbodiimide compound (a-4) with a number average molecular weight of about 3,500 and a carbodiimide equivalent of 1,723 was obtained in the same manner as in Preparation Example (a-1) except that 38.8 parts of a carboxyl group-terminated polycaprolactone ring-opening polymerization product with a molecular weight of 1,000 was used in lieu of 84.6 parts of the carboxyl group-terminated polycaprolactone ring-opening polymerization product with a molecular weight of 2,000 and that the amount of propylene glycol monomethyl ether acetate was decreased to 306.8 parts.

PREPARATION EXAMPLE a-5

A four-necked flask equipped with a reflux condenser, nitrogen gas inlet tube, stirring rod and thermometer was charged with 50.0 parts of an isocyanate group-containing polycarbodiimide compound with a carbodiimide equivalent of 316, 1.8 parts of ethylene glycol and 57.9 parts of poly(3-methylpentyl adipate) diol with a molecular weight of 1,000, the mixture was maintained at about 100° C. for 5 hours to allow the isocyanate group to react with the hydroxyl group, 84.6 parts of a carboxyl group-terminated polycaprolactone ring-opening polymerization product with a molecular weight of 2,000 was then added, and the whole mixture was maintained at about 100° C. for 2 hours to allow the carbodiimide group to react with the carboxyl group. Thereafter, 291.5 parts of propylene glycol monomethyl ether acetate was added. A carbodiimide compound (a-5) with a number average molecular weight of about 3,300 and a carbodiimide equivalent of 1,588 was thus obtained.

COMPARATIVE PREPARATION EXAMPLE a-6

A four-necked flask equipped with a reflux condenser, nitrogen gas inlet tube, stirring rod and thermometer was charged with 50.0 parts of an isocyanate group-containing polycarbodiimide compound with a carbodiimide equivalent of 96 and 0.72 parts of poly(3-methylpentyl adipate) diol with a molecular weight of 500, the mixture was maintained at about 100° C. for 5 hours to allow the isocyanate group to react with the hydroxyl group, 0.37 parts of a carboxyl group-terminated polycaprolactone ring-opening polymerization product with a molecular weight of 500 was then added, and the whole mixture was maintained at about 100° C. for 2 hours to allow the carbodiimide group to react with the carboxyl group. Thereafter, 77.0 parts of propylene glycol monomethyl ether acetate was added. A carbodiimide compound (a-6) with a number average molecular weight of about 70,000 and a carbodiimide equivalent of 98 was thus obtained.

COMPARATIVE PREPARATION EXAMPLE a-7

A four-necked flask equipped with a reflux condenser, nitrogen gas inlet tube, stirring rod and thermometer was charged with 5.0 parts of an isocyanate group-containing polycarbodiimide compound with a carbodiimide equivalent of 322 and 464.3 parts of poly(3-methylpentyl adipate) diol with a molecular weight of 30,000, the mixture was maintained at about 100° C. for 5 hours to allow the isocyanate group to react with the hydroxyl group, 310.6 parts of a carboxyl group-terminated polycaprolactone ring-opening polymerization product with a molecular weight of 40,000 was then added, and the whole mixture was maintained at about 100° C. for 2 hours to allow the carbodiimide group to react with the carboxyl group. Thereafter, 1,170 parts of propylene glycol monomethyl ether acetate was added. A carbodiimide compound (a-7) with a number average molecular weight of about 101,000 and a carbodiimide equivalent of 50,233 was thus obtained.

COMPARATIVE PREPARATION EXAMPLE a-8

A four-necked flask equipped with a reflux condenser, nitrogen gas inlet tube, stirring rod and thermometer was charged with 5.0 parts of an isocyanate group-containing polycarbodiimide compound with a carbodiimide equivalent of 316 and 115.7 parts of poly(3-methylpentyl adipate) diol with a molecular weight of 1,000, and the mixture was maintained at about 100° C. for 5 hours to allow the isocyanate group to react with the hydroxyl group. Thereafter, 248.6 parts of propylene glycol monomethyl ether acetate was added. A grafted side chain-free carbodiimide compound (a-8) with a number average molecular weight of about 2,800 and a carbodiimide equivalent of 1,048 was thus obtained.

COMPARATIVE PREPARATION EXAMPLE a-9

A carbodiimide group-free compound (a-9) with a number average molecular weight of about 8,500 was obtained in the same manner as in Preparation Example (a-1) except that 338.6 parts of a carboxyl group-terminated polycaprolactone ring-opening polymerization product with a molecular weight of 1,000 was used in lieu of 84.6 parts of the carboxyl group-terminated polycaprolactone ring-opening polymerization product with a molecular weight of 2,000 and that the amount of propylene glycol monomethyl ether acetate was increased to 756.5 parts.

<b. Preparation of Polyether Side Chain-Containing Carbodiimide Compounds etc.>

PREPARATION EXAMPLE b-1

A carbodiimide compound (b-1) with a number average molecular weight of about 4,200 and a carbodiimide equivalent of 2,053 was obtained in the same manner as in Preparation Example (a-1) except that a carboxyl group-terminated propylene oxide ring-opening polymerization product with a molecular weight of 2,000 was used in lieu of the carboxyl group-terminated polycaprolactone ring-opening polymerization product with a molecular weight of 2,000.

PREPARATION EXAMPLE b-2

A carbodiimide compound (b-2) with a number average molecular weight of about 4,200 and a carbodiimide equivalent of 2,053 was obtained in the same manner as in Preparation Example (b-1) except that polypropylene glycol with a molecular weight of 1,000 was used in lieu of the poly(3-methylpentyl adipate) diol with a molecular weight of 1,000.

PREPARATION EXAMPLE b-3

A carbodiimide compound (b-3) with a number average molecular weight of about 4,200 and a carbodiimide equivalent of 2,053 was obtained in the same manner as in Preparation Example (b-1) except that polybutyl methacrylate diol with a molecular weight of 1,000 was used in lieu of the poly(3-methylpentyl adipate) diol with a molecular weight of 1,000.

PREPARATION EXAMPLE b-4

A carbodiimide compound (b-4) with a number average molecular weight of about 3,500 and a carbodiimide equivalent of 1,723 was obtained in the same manner as in Preparation Example (b-1) except that 38.8 parts of a carboxyl group-terminated propylene oxide ring-opening polymerization product with a molecular weight of 1,000 was used in lieu of 84.6 parts of the carboxyl group-terminated propylene oxide ring-opening polymerization product with a molecular weight of 2,000 and that the amount of propylene glycol monomethyl ether acetate was decreased to 306.8 parts.

PREPARATION EXAMPLE b-5

A four-necked flask equipped with a reflux condenser, nitrogen gas inlet tube, stirring rod and thermometer was charged with 50.0 parts of an isocyanate group-containing polycarbodiimide compound with a carbodiimide equivalent of 316, 1.8 parts of ethylene glycol and 57.9 parts of poly(3-methylpentyl adipate) diol with a molecular weight of 1,000, the mixture was maintained at about 100° C. for 5 hours to allow the isocyanate group to react with the hydroxyl group, 84.6 parts of a carboxyl group-terminated propylene oxide ring-opening polymerization product with a molecular weight of 2,000 was then added, and the whole mixture was maintained at about 100° C. for 2 hours to allow the carbodiimide group to react with the carboxyl group. Thereafter, 291.5 parts of propylene glycol monomethyl ether acetate was added. A carbodiimide compound (b-5) with a number average molecular weight of about 3,300 and a carbodiimide equivalent of 1,588 was thus obtained.

COMPARATIVE PREPARATION EXAMPLE b-6

A four-necked flask equipped with a reflux condenser, nitrogen gas inlet tube, stirring rod and thermometer was charged with 50.0 parts of an isocyanate group-containing polycarbodiimide with a carbodiimide equivalent of 96 and 0.72 parts of poly(3-methylpentyl adipate) diol with a molecular weight of 500, the mixture was maintained at about 100° C. for 5 hours to allow the isocyanate group to react with the hydroxyl group, 0.37 parts of a carboxyl group-terminated propylene oxide ring-opening polymerization product with a molecular weight of 500 was then added, and the whole mixture was maintained at about 100° C. for 2 hours to allow the carbodiimide group to react with the carboxyl group. Thereafter, 77.0 parts of propylene glycol monomethyl ether acetate was added. A carbodiimide compound (b-6) with a number average molecular weight of about 70,000 and a carbodiimide equivalent of 98 was thus obtained.

COMPARATIVE PREPARATION EXAMPLE b-7

A four-necked flask equipped with a reflux condenser, nitrogen gas inlet tube, stirring rod and thermometer was charged with 5.0 parts of an isocyanate group-containing polycarbodiimide with a carbodiimide equivalent of 322 and 464.3 parts of poly(3-methylpentyl adipate) diol with a molecular weight of 30,000, the mixture was maintained at about 100° C. for 5 hours to allow the isocyanate group to react with the hydroxyl group, 310.6 parts of a carboxyl group-terminated propylene oxide ring-opening polymerization product with a molecular weight of 40,000 was then added, and the whole mixture was maintained at about 100° C. for 2 hours to allow the carbodiimide group to react with the carboxyl group. Thereafter, 1,170 parts of propylene glycol monomethyl ether acetate was added. A carbodiimide compound (b-7) with a number average molecular weight of about 101,000 and a carbodiimide equivalent of 50,223 was thus obtained.

COMPARATIVE PREPARATION EXAMPLE b-8

A four-necked flask equipped with a reflux condenser, nitrogen gas inlet tube, stirring rod and thermometer was charged with 50.0 parts of an isocyanate group-containing polycarbodiimide with a carbodiimide equivalent of 316 and 115.7 parts of poly(3-methylpentyl adipate) diol with a molecular weight of 1,000, and the mixture was maintained at about 100° C. for 5 hours to allow the isocyanate group to react with the hydroxyl group. Thereafter, 248.6 parts of propylene glycol monomethyl ether acetate was added. A grafted side chain-free carbodiimide compound (b-8) with a number average molecular weight of about 2,800 and a carbodiimide equivalent of 1,048 was thus obtained.

COMPARATIVE PREPARATION EXAMPLE b-9

A carbodiimide group-free compound (b-9) with a number average molecular weight of about 8,500 was obtained in the same manner as in Preparation Example (b-1) except that the amount of the carboxyl group-terminated propylene oxide ring-opening polymerization product with a molecular weight of 2,000 was increased to 338.6 parts and the amount of propylene glycol monomethyl ether acetate was increased to 756.5 parts.

<c. Preparation of Polyacrylic Side Chain-Containing Carbodiimide Compounds etc.>

PREPARATION EXAMPLE c-1

A carbodiimide compound (c-1) with a number average molecular weight of about 4,200 and a carbodiimide equivalent of 2,053 was obtained in the same manner as in Preparation Example (a-1) except that a carboxyl group-containing (meth)acrylic polymer with a molecular weight of 2,000 was used in lieu of the carboxyl group-terminated polycaprolactone ring-opening polymerization product with a molecular weight of 2,000.

PREPARATION EXAMPLE c-2

A carbodiimide compound (c-2) with a number average molecular weight of about 4,200 and a carbodiimide equivalent of 2,053 was obtained in the same manner as in Preparation Example (c-1) except that polypropylene glycol with a molecular weight of 1,000 was used in lieu of the poly(3-methylpentyl adipate) diol with a molecular weight of 1,000.

PREPARATION EXAMPLE c-3

A carbodiimide compound (c-3) with a number average molecular weight of about 4,200 and a carbodiimide equivalent of 2,053 was obtained in the same manner as in Preparation Example (c-1) except that polybutyl methacrylate diol with a molecular weight of 1,000 was used in lieu of the poly(3-methylpentyl adipate) diol with a molecular weight of 1,000.

PREPARATION EXAMPLE c-4

A carbodiimide compound (c-4) with a number average molecular weight of about 3,500 and a carbodiimide equivalent of 1,723 was obtained in the same manner as in Preparation Example (c-1) except that 38.8 parts of a carboxyl group-containing (meth)acrylic polymer with a molecular weight of 1,000 was used in lieu of 84.6 parts of the carboxyl group-containing (meth)acrylic polymer with a molecular weight of 2,000 and that the amount of propylene glycol monomethyl ether acetate was decreased to 306.8 parts.

PREPARATION EXAMPLE c-5

A four-necked flask equipped with a reflux condenser, nitrogen gas inlet tube, stirring rod and thermometer was charged with 50.0 parts of an isocyanate group-containing polycarbodiimide compound with a carbodiimide equivalent of 316, 1.8 parts of ethylene glycol and 57.9 parts of poly(3-methylpentyl adipate) diol with a molecular weight of 1,000, the mixture was maintained at about 100° C. for 5 hours to allow the isocyanate group to react with the hydroxyl group, 84.6 parts of a carboxyl group-containing (meth)acrylic polymer with a molecular weight of 2,000 was then added, and the whole mixture was maintained at about 100° C. for 2 hours to allow the carbodiimide group to react with the carboxyl group. Thereafter, 291.5 parts of propylene glycol monomethyl ether acetate was added. A carbodiimide compound (c-5) with a number average molecular weight of about 3,300 and a carbodiimide equivalent of 1,587 was thus obtained.

COMPARATIVE PREPARATION EXAMPLE c-6

A four-necked flask equipped with a reflux condenser, nitrogen gas inlet tube, stirring rod and thermometer was charged with 50.0 parts of an isocyanate group-containing polycarbodiimide with a carbodiimide equivalent of 96 and 0.72 parts of poly(3-methylpentyl adipate) diol with a molecular weight of 500, the mixture was maintained at about 100° C. for 5 hours to allow the isocyanate group to react with the hydroxyl group, 0.37 parts of a carboxyl group-containing acrylic polymer with a molecular weight of 500 was then added, and the whole mixture was maintained at about 100° C. for 2 hours to allow the carbodiimide group to react with the carboxyl group. Thereafter, 77.0 parts of propylene glycol monomethyl ether acetate was added. A carbodiimide compound (c-6) with a number average molecular weight of about 70,000 and a carbodiimide equivalent of 98 was thus obtained.

COMPARATIVE PREPARATION EXAMPLE c-7

A four-necked flask equipped with a reflux condenser, nitrogen gas inlet tube, stirring rod and thermometer was charged with 5.0 parts of an isocyanate group-containing polycarbodiimide with a carbodiimide equivalent of 322 and 464.3 parts of poly(3-methylpentyl adipate) diol with a molecular weight of 30,000, the mixture was maintained at about 100° C. for 5 hours to allow the isocyanate group to react with the hydroxyl group, 310.6 parts of a carboxyl group-containing acrylic polymer with a molecular weight of 40,000 was then added, and the whole mixture was maintained at about 100° C. for 2 hours to allow the carbodiimide group to react with the carboxyl group. Thereafter, 1,170 parts of propylene glycol monomethyl ether acetate was added. A carbodiimide compound (c-7) with a number average molecular weight of about 101,000 and a carbodiimide equivalent of 50,223 was thus obtained.

COMPARATIVE PREPARATION EXAMPLE c-8

A four-necked flask equipped with a reflux condenser, nitrogen gas inlet tube, stirring rod and thermometer was charged with 50.0 parts of an isocyanate group-containing polycarbodiimide with a carbodiimide equivalent of 316 and 115.7 parts of poly(3-methylpentyl adipate) diol with a molecular weight of 1,000, and the mixture was maintained at about 100° C. for 5 hours to allow the isocyanate group to react with the hydroxyl group. Thereafter, 248.6 parts of propylene glycol monomethyl ether acetate was added. A grafted side chain-free carbodiimide compound (c-8) with a number average molecular weight of about 2,800 and a carbodiimide equivalent of 1,048 was thus obtained.

COMPARATIVE PREPARATION EXAMPLE c-9

A carbodiimide group-free compound (c-9) with a number average molecular weight of about 8,500 was obtained in the same manner as in Preparation Example (c-1) except that the amount of the carboxyl group-containing (meth)acrylic polymer with a molecular weight of 2,000 was increased to 338.6 parts and the amount of propylene glycol monomethyl ether acetate was increased to 756.5 parts.

<Pigment: Carbon Black>

[Preparation of Treated Pigment of Example 1 and Dispersion Composition Comprising same]

A 1,000-ml steel can containing 1,000 g of steel beads (ø5 mm) was charged with 50 g of carbon black A (average primary particle size 56 nm, pH=3.1) and 450 g of purified water. This mixture was milled for 30 minutes using a paint conditioner to give an aqueous pigment dispersion. This aqueous pigment dispersion was transferred to a four-necked flask equipped with a reflux condenser, nitrogen inlet tube, stirring rod and thermometer, 50 g of the carbodiimide compound (a-1) and 170 g of propylene glycol monomethyl ether acetate were added with stirring, and the reaction was allowed to proceed at about 90° C. for 8 hours. Thereafter, the purified water and propylene glycol monomethyl ether acetate were removed, and the residue was placed in a vacuum drier and dried at 80° C. for 2 hours to give a treated pigment (surface-treated pigment of Example 1; surface-treated pigment 1) as surface-treated with the carbodiimide compound. Further, the formulation materials shown in Table 1 were milled in a bead mill at a temperature of 60° C. for 1 day to give a dispersion composition comprising the surface-treated pigment of Example 1.

[Preparation of Treated Pigment of Example 9 and Dispersion Composition Comprising same]

A carbodiimide compound surface-treated pigment (surface-treated pigment of Example 9; surface-treated pigment 2) was obtained in the same manner as in Example 1 except that the carbodiimide compound (b-1) was used in lieu of the carbodiimide compound (a-1). Further, a dispersion composition comprising the surface-treated pigment of Example 9 was obtained by milling the formulation materials shown in Table 1 in a bead mill at a temperature of 60° C. for 1 day.

[Preparation of Treated Pigment of Example 17 and Dispersion Composition Comprising same]

A carbodiimide compound surface-treated pigment (surface-treated pigment of Example 17; surface-treated pigment 3) was obtained in the same manner as in Example 1 except that the carbodiimide compound (c-1) was used in lieu of the carbodiimide compound (a-1). Further, a dispersion composition comprising the surface-treated pigment of Example 17 was obtained by milling the formulation materials shown in Table 1 in a bead mill at a temperature of 60° C. for 1 day.

[Preparation of Dispersion Compositions of Examples 2 to 8, 10 to 16 and 18 to 24 and of Comparative Examples 1 to 18]

Dispersion compositions comprising the treated carbon black species of Examples 2 to 8, 10 to 16 and 18 to 24 and of Comparative Examples 1 to 18 were prepared each by kneading the materials for each formulation given in Table 1, 2 or 3 in a bead mill for 1 day.

[Preparation of Pigment Dispersion-Based Resist Compositions of Examples 1 to 24 and Comparative Examples 1 to 18 for Producing Black Matrices]

Pigment dispersion-based resist compositions of Examples 1 to 24 and Comparative Examples 1 to 18 for black matrices were obtained by uniformly mixing and milling, using a high-speed stirrer, each of the above-mentioned treated carbon black dispersions of Examples 1 to 24 and Comparative Examples 1 to 18 with the other materials for the formulation in question given in Table 4, 5 or 6, followed by filtration through a filter with a pore size of 3 μm.

[Evaluation Tests]

1. Dispersion Stability

The treated carbon black dispersion compositions of Examples 1 to 24 and Comparative Examples 1 to 18 and the pigment dispersion-based resist compositions of Examples 1 to 24 and Comparative Examples 1 to 18 for black matrices were each sampled and placed in a glass bottle and, after tight closure, stored at room temperature for 7 days, and the state of the composition was evaluated according to the criteria given below. The evaluation results are shown in Tables 1 to 6.

Evaluation Criteria

A: Neither viscosity increase nor precipitate formation is observed.

B: Such an extent of viscosity increase and/or precipitate formation that can be returned to the original state upon gentle shaking is observed.

C: Such an extent of viscosity increase and/or precipitate formation that cannot be returned to the original state even upon vigorous shaking is observed.

2. Resist Pattern Optical Density (OD Value)

Those pigment dispersion-based resist compositions for black matrices which had been given the evaluation A or B in the above dispersion stability evaluation were each applied onto a glass substrate to a film thickness of 1 μm using a spin coater. After 3 minutes of prebaking at 100° C., each coat film was exposed to light from a high-pressure mercury lamp and further post-baked at 230° C. for 30 minutes to give an all over coated resist pattern. The evaluation results thus obtained are shown in Tables 4 to 6.

The optical density (OD value) of each all over coated resist pattern was measured on a Macbeth densitometer (TD-931, product of Macbeth).

3. Resist Pattern Resistance Value

The surface resistance value of each resist pattern obtained by the above method was measured using a resistance measuring apparatus (R8340/8340A, brand name, product of Avantest Corp.). The evaluation results are shown in Tables 4 to 6.

4. Resist Pattern Developability

Those pigment dispersion-based resist compositions for black matrices which had been given the evaluation A or B in the above dispersion stability evaluation were each applied to a glass substrate to a film thickness of 1 μm using a spin coater. Each coat film was prebaked at 100° C. for 3 minutes. The coat film obtained was developed using an aqueous 0.15% solution of $Na_2CO_3$, and the developability thereof was evaluated in terms of the time required for complete removal of the uncured portion of the resist composition. The evaluation results are shown in Tables 4 to 6.

A: Complete removal attainable within 30 seconds.

B: Complete removal attainable within a time longer than 30 seconds but not longer than 60 seconds.

C: No complete removal attainable even after 60 seconds.

TABLE 1

|  |  | Example | | | | | | | | Comparative Example | | | | | |
| --- | --- | --- | --- | --- | --- | --- | --- | --- | --- | --- | --- | --- | --- | --- | --- |
|  |  | 1 | 2 | 3 | 4 | 5 | 6 | 7 | 8 | 1 | 2 | 3 | 4 | 5 | 6 |
| Carbon black A |  | — | 20 | 20 | 20 | 20 | 20 | — | — | 20 | 20 | 20 | 20 | 20 | 20 |
| Carbon black B |  | — | — | — | — | — | — | 20 | — | — | — | — | — | — | — |
| Carbon black C |  | — | — | — | — | — | — | — | 20 | — | — | — | — | — | — |
| Surface-treated pigment 1 |  | 28 | — | — | — | — | — | — | — | — | — | — | — | — | — |
| Carbodiimide compound (solid) | a-1 | — | 8 | — | — | — | — | 8 | 8 | — | — | — | — | — | — |
|  | a-2 | — | — | 8 | — | — | — | — | — | — | — | — | — | — | — |
|  | a-3 | — | — | — | 8 | — | — | — | — | — | — | — | — | — | — |
|  | a-4 | — | — | — | — | 8 | — | — | — | — | — | — | — | — | — |
|  | a-5 | — | — | — | — | — | 8 | — | — | — | — | — | — | — | — |
|  | a-6 | — | — | — | — | — | — | — | — | 8 | — | — | — | — | — |
|  | a-7 | — | — | — | — | — | — | — | — | — | 8 | — | — | — | — |
|  | a-8 | — | — | — | — | — | — | — | — | — | — | 8 | — | — | — |
| Carbodiimide group-free compound (solid) | a-9 | — | — | — | — | — | — | — | — | — | — | — | 8 | — | — |
| Pigment dispersant (solid) | A | — | — | — | — | — | — | — | — | — | — | — | — | 2 | — |
|  | B | — | — | — | — | — | — | — | — | — | — | — | — | — | 6 |
| Solvent | PGMEA | 72 | 72 | 72 | 72 | 72 | 72 | 72 | 72 | 72 | 72 | 72 | 72 | 78 | 74 |
| Total |  | 100 | 100 | 100 | 100 | 100 | 100 | 100 | 100 | 100 | 100 | 100 | 100 | 100 | 100 |
| (Evaluation) | Dispersion stability | A | A | A | A | A | A | A | A | A | B | B | C | B | B |

TABLE 2

|  |  | Example | | | | | | | | Comparative Example | | | | | |
| --- | --- | --- | --- | --- | --- | --- | --- | --- | --- | --- | --- | --- | --- | --- | --- |
|  |  | 9 | 10 | 11 | 12 | 13 | 14 | 15 | 16 | 7 | 8 | 9 | 10 | 11 | 12 |
| Carbon black A |  | — | 20 | 20 | 20 | 20 | 20 | — | — | 20 | 20 | 20 | 20 | 20 | 20 |
| Carbon black B |  | — | — | — | — | — | — | 20 | — | — | — | — | — | — | — |
| Carbon black C |  | — | — | — | — | — | — | — | 20 | — | — | — | — | — | — |
| Surface-treated pigment 2 |  | 28 | — | — | — | — | — | — | — | — | — | — | — | — | — |
| Carbodiimide compound (solid) | b-1 | — | 8 | — | — | — | — | 8 | 8 | — | — | — | — | — | — |
|  | b-2 | — | — | 8 | — | — | — | — | — | — | — | — | — | — | — |
|  | b-3 | — | — | — | 8 | — | — | — | — | — | — | — | — | — | — |
|  | b-4 | — | — | — | — | 8 | — | — | — | — | — | — | — | — | — |
|  | b-5 | — | — | — | — | — | 8 | — | — | — | — | — | — | — | — |
|  | b-6 | — | — | — | — | — | — | — | — | 8 | — | — | — | — | — |
|  | b-7 | — | — | — | — | — | — | — | — | — | 8 | — | — | — | — |
|  | b-8 | — | — | — | — | — | — | — | — | — | — | 8 | — | — | — |
| Carbodiimide group-free compound (solid) | b-9 | — | — | — | — | — | — | — | — | — | — | — | 8 | — | — |
| Pigment dispersant (solid) | A | — | — | — | — | — | — | — | — | — | — | — | — | 2 | — |
|  | B | — | — | — | — | — | — | — | — | — | — | — | — | — | 6 |
| Solvent | PGMEA | 72 | 72 | 72 | 72 | 72 | 72 | 72 | 72 | 72 | 72 | 72 | 72 | 78 | 74 |
| Total |  | 100 | 100 | 100 | 100 | 100 | 100 | 100 | 100 | 100 | 100 | 100 | 100 | 100 | 100 |
| (Evaluation) | Dispersion stability | A | A | A | A | A | A | A | A | A | B | B | C | B | B |

TABLE 3

|  |  | Example | | | | | | | | Comparative Example | | | | | |
| --- | --- | --- | --- | --- | --- | --- | --- | --- | --- | --- | --- | --- | --- | --- | --- |
|  |  | 17 | 18 | 19 | 20 | 21 | 22 | 23 | 24 | 13 | 14 | 15 | 16 | 17 | 18 |
| Carbon black A |  | — | 20 | 20 | 20 | 20 | 20 | — | — | 20 | 20 | 20 | 20 | 20 | 20 |
| Carbon black B |  | — | — | — | — | — | — | 20 | — | — | — | — | — | — | — |
| Carbon black C |  | — | — | — | — | — | — | — | 20 | — | — | — | — | — | — |
| Surface-treated pigment 3 |  | 28 | — | — | — | — | — | — | — | — | — | — | — | — | — |
| Carbodiimide compound (solid) | c-1 | — | 8 | — | — | — | — | 8 | 8 | — | — | — | — | — | — |
|  | c-2 | — | — | 8 | — | — | — | — | — | — | — | — | — | — | — |
|  | c-3 | — | — | — | 8 | — | — | — | — | — | — | — | — | — | — |

TABLE 3-continued

| | | Example | | | | | | | | Comparative Example | | | | | |
|---|---|---|---|---|---|---|---|---|---|---|---|---|---|---|---|
| | | 17 | 18 | 19 | 20 | 21 | 22 | 23 | 24 | 13 | 14 | 15 | 16 | 17 | 18 |
| | c-4 | — | — | — | — | 8 | — | — | — | — | — | — | — | — | — |
| | c-5 | — | — | — | — | — | 8 | — | — | — | — | — | — | — | — |
| | c-6 | — | — | — | — | — | — | — | — | 8 | — | — | — | — | — |
| | c-7 | — | — | — | — | — | — | — | — | — | 8 | — | — | — | — |
| | c-8 | — | — | — | — | — | — | — | — | — | — | 8 | — | — | — |
| Carbodiimide group-free compound (solid) | c-9 | — | — | — | — | — | — | — | — | — | — | — | 8 | — | — |
| Pigment dispersant (solid) | A | — | — | — | — | — | — | — | — | — | — | — | — | 2 | — |
| | B | — | — | — | — | — | — | — | — | — | — | — | — | — | 6 |
| Solvent | PGMEA | 72 | 72 | 72 | 72 | 72 | 72 | 72 | 72 | 72 | 72 | 72 | 72 | 78 | 74 |
| Total | | 100 | 100 | 100 | 100 | 100 | 100 | 100 | 100 | 100 | 100 | 100 | 100 | 100 | 100 |
| (Evaluation) | Dispersion stability | A | A | A | A | A | A | A | A | A | B | B | C | B | B |

TABLE 4

| | | Pigment dispersion-based resist composition | | | | | | | | | | | | | |
|---|---|---|---|---|---|---|---|---|---|---|---|---|---|---|---|
| | | Example | | | | | | | | Comparative Example | | | | | |
| | | 1 | 2 | 3 | 4 | 5 | 6 | 7 | 8 | 1 | 2 | 3 | 4 | 5 | 6 |
| Surface-treated pigment dispersion composition | Example 1 | 40 | — | — | — | — | — | — | — | — | — | — | — | — | — |
| | Example 2 | — | 40 | — | — | — | — | — | — | — | — | — | — | — | — |
| | Example 3 | — | — | 40 | — | — | — | — | — | — | — | — | — | — | — |
| | Example 4 | — | — | — | 40 | — | — | — | — | — | — | — | — | — | — |
| | Example 5 | — | — | — | — | 40 | — | — | — | — | — | — | — | — | — |
| | Example 6 | — | — | — | — | — | 40 | — | — | — | — | — | — | — | — |
| | Example 7 | — | — | — | — | — | — | 40 | — | — | — | — | — | — | — |
| | Example 8 | — | — | — | — | — | — | — | 40 | — | — | — | — | — | — |
| | Comp. Exam. 1 | — | — | — | — | — | — | — | — | 40 | — | — | — | — | — |
| | Comp. Exam. 2 | — | — | — | — | — | — | — | — | — | 40 | — | — | — | — |
| | Comp. Exam. 3 | — | — | — | — | — | — | — | — | — | — | 40 | — | — | — |
| | Comp. Exam. 4 | — | — | — | — | — | — | — | — | — | — | — | 40 | — | — |
| | Comp. Exam. 5 | — | — | — | — | — | — | — | — | — | — | — | — | 40 | — |
| | Comp. Exam. 6 | — | — | — | — | — | — | — | — | — | — | — | — | — | 40 |
| BMA/MAA copolymer | | 5.6 | 5.6 | 5.6 | 5.6 | 5.6 | 5.6 | 5.6 | 5.6 | 5.6 | 5.6 | 5.6 | 5.6 | 7.1 | 6.1 |
| DPEHA | | 2.4 | 2.4 | 2.4 | 2.4 | 2.4 | 2.4 | 2.4 | 2.4 | 2.4 | 2.4 | 2.4 | 2.4 | 3.1 | 2.6 |
| Irgacure 907 | | 0.8 | 0.8 | 0.8 | 0.8 | 0.8 | 0.8 | 0.8 | 0.8 | 0.8 | 0.8 | 0.8 | 0.8 | 1 | 0.9 |
| PGMEA | | 51.2 | 51.2 | 51.2 | 51.2 | 51.2 | 51.2 | 51.2 | 51.2 | 51.2 | 51.2 | 51.2 | 51.2 | 48.8 | 50.4 |
| Total | | 100.0 | 100.0 | 100.0 | 100.0 | 100.0 | 100.0 | 100.0 | 100.0 | 100.0 | 100.0 | 100.0 | 100.0 | 100.0 | 100.0 |
| (Evaluation) | Dispersion stability | A | A | A | A | A | A | A | A | C | B | B | C | B | B |
| | OD | 3.9 | 3.9 | 3.8 | 3.8 | 3.9 | 3.8 | 3.4 | 3.4 | — | 3.6 | 3.9 | — | 3.8 | 3.8 |
| | Resistance | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | — | $1 \times 10^{5}$ | $1 \times 10^{8}$ | — | $1 \times 10^{5}$ | $1 \times 10^{5}$ |
| | Developability | B | A | B | B | B | B | B | B | — | C | B | — | B | C |

TABLE 5

| | | Pigment dispersion-based resist composition | | | | | | | | | | | | | |
|---|---|---|---|---|---|---|---|---|---|---|---|---|---|---|
| | | Example | | | | | | | | Comparative Example | | | | | |
| | | 9 | 10 | 11 | 12 | 13 | 14 | 15 | 16 | 7 | 8 | 9 | 10 | 11 | 12 |
| Surface-treated pigment dispersion composition | Example 9 | 40 | — | — | — | — | — | — | — | — | — | — | — | — | — |
| | Example 10 | — | 40 | — | — | — | — | — | — | — | — | — | — | — | — |
| | Example 11 | — | — | 40 | — | — | — | — | — | — | — | — | — | — | — |
| | Example 12 | — | — | — | 40 | — | — | — | — | — | — | — | — | — | — |
| | Example 13 | — | — | — | — | 40 | — | — | — | — | — | — | — | — | — |
| | Example 14 | — | — | — | — | — | 40 | — | — | — | — | — | — | — | — |
| | Example 15 | — | — | — | — | — | — | 40 | — | — | — | — | — | — | — |
| | Example 16 | — | — | — | — | — | — | — | 40 | — | — | — | — | — | — |
| | Comp. Exam. 7 | — | — | — | — | — | — | — | — | 40 | — | — | — | — | — |
| | Comp. Exam. 8 | — | — | — | — | — | — | — | — | — | 40 | — | — | — | — |
| | Comp. Exam. 9 | — | — | — | — | — | — | — | — | — | — | 40 | — | — | — |
| | Comp. Exam. 10 | — | — | — | — | — | — | — | — | — | — | — | 40 | — | — |
| | Comp. Exam. 11 | — | — | — | — | — | — | — | — | — | — | — | — | 40 | — |
| | Comp. Exam. 12 | — | — | — | — | — | — | — | — | — | — | — | — | — | 40 |
| BMA/MAA copolymer | | 5.6 | 5.6 | 5.6 | 5.6 | 5.6 | 5.6 | 5.6 | 5.6 | 5.6 | 5.6 | 5.6 | 5.6 | 7.1 | 6.1 |
| DPEHA | | 2.4 | 2.4 | 2.4 | 2.4 | 2.4 | 2.4 | 2.4 | 2.4 | 2.4 | 2.4 | 2.4 | 2.4 | 3.1 | 2.6 |
| Irgacure 907 | | 0.8 | 0.8 | 0.8 | 0.8 | 0.8 | 0.8 | 0.8 | 0.8 | 0.8 | 0.8 | 0.8 | 0.8 | 1 | 0.9 |
| PGMEA | | 51.2 | 51.2 | 51.2 | 51.2 | 51.2 | 51.2 | 51.2 | 51.2 | 51.2 | 51.2 | 51.2 | 51.2 | 48.8 | 50.4 |
| Total | | 100.0 | 100.0 | 100.0 | 100.0 | 100.0 | 100.0 | 100.0 | 100.0 | 100.0 | 100.0 | 100.0 | 100.0 | 100.0 | 100.0 |
| (Evaluation) | Dispersion stability | A | A | A | A | A | A | A | A | C | B | B | C | B | B |
| | OD | 3.9 | 3.9 | 3.8 | 3.8 | 3.9 | 3.8 | 3.4 | 3.4 | — | 3.6 | 3.9 | — | 3.8 | 3.8 |
| | Resistance | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | — | $1 \times 10^{5}$ | $1 \times 10^{8}$ | — | $1 \times 10^{5}$ | $1 \times 10^{5}$ |
| | Developability | A | A | A | A | A | A | A | A | — | C | B | — | B | C |

TABLE 6

| | | Pigment dispersion-based resist composition | | | | | | | | | | | | | |
|---|---|---|---|---|---|---|---|---|---|---|---|---|---|---|---|
| | | Example | | | | | | | | Comparative Example | | | | | |
| | | 17 | 18 | 19 | 20 | 21 | 22 | 23 | 24 | 13 | 14 | 15 | 16 | 17 | 18 |
| Surface-treated pigment dispersion composition | Example 17 | 40 | — | — | — | — | — | — | — | — | — | — | — | — | — |
| | Example 18 | — | 40 | — | — | — | — | — | — | — | — | — | — | — | — |
| | Example 19 | — | — | 40 | — | — | — | — | — | — | — | — | — | — | — |
| | Example 20 | — | — | — | 40 | — | — | — | — | — | — | — | — | — | — |
| | Example 21 | — | — | — | — | 40 | — | — | — | — | — | — | — | — | — |
| | Example 22 | — | — | — | — | — | 40 | — | — | — | — | — | — | — | — |
| | Example 23 | — | — | — | — | — | — | 40 | — | — | — | — | — | — | — |
| | Example 24 | — | — | — | — | — | — | — | 40 | — | — | — | — | — | — |
| | Comp. Exam. 13 | — | — | — | — | — | — | — | — | 40 | — | — | — | — | — |
| | Comp. Exam. 14 | — | — | — | — | — | — | — | — | — | 40 | — | — | — | — |
| | Comp. Exam. 15 | — | — | — | — | — | — | — | — | — | — | 40 | — | — | — |
| | Comp. Exam. 16 | — | — | — | — | — | — | — | — | — | — | — | 40 | — | — |
| | Comp. Exam. 17 | — | — | — | — | — | — | — | — | — | — | — | — | 40 | — |
| | Comp. Exam. 18 | — | — | — | — | — | — | — | — | — | — | — | — | — | 40 |
| BMA/MAA copolymer | | 5.6 | 5.6 | 5.6 | 5.6 | 5.6 | 5.6 | 5.6 | 5.6 | 5.6 | 5.6 | 5.6 | 5.6 | 7.1 | 6.1 |
| DPEHA | | 2.4 | 2.4 | 2.4 | 2.4 | 2.4 | 2.4 | 2.4 | 2.4 | 2.4 | 2.4 | 2.4 | 2.4 | 3.1 | 2.6 |
| Irgacure 907 | | 0.8 | 0.8 | 0.8 | 0.8 | 0.8 | 0.8 | 0.8 | 0.8 | 0.8 | 0.8 | 0.8 | 0.8 | 1 | 0.9 |
| PGMEA | | 51.2 | 51.2 | 51.2 | 51.2 | 51.2 | 51.2 | 51.2 | 51.2 | 51.2 | 51.2 | 51.2 | 51.2 | 48.8 | 50.4 |
| Total | | 100.0 | 100.0 | 100.0 | 100.0 | 100.0 | 100.0 | 100.0 | 100.0 | 100.0 | 100.0 | 100.0 | 100.0 | 100.0 | 100.0 |
| (Evaluation) | Dispersion stability | A | A | A | A | A | A | A | A | C | B | B | C | B | B |

TABLE 6-continued

| | Pigment dispersion-based resist composition | | | | | | | | | | | | | |
|---|---|---|---|---|---|---|---|---|---|---|---|---|---|---|
| | Example | | | | | | | | Comparative Example | | | | | |
| | 17 | 18 | 19 | 20 | 21 | 22 | 23 | 24 | 13 | 14 | 15 | 16 | 17 | 18 |
| OD | 3.9 | 3.9 | 3.8 | 3.8 | 3.9 | 3.8 | 3.4 | 3.4 | — | 3.6 | 3.9 | — | 3.8 | 3.8 |
| Resistance | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | $\geq 1 \times 10^{13}$ | — | $1 \times 10^{5}$ | $1 \times 10^{8}$ | — | $1 \times 10^{5}$ | $1 \times 10^{5}$ |
| Developability | B | A | B | B | B | B | B | B | — | C | B | — | B | C |

In Tables 1 to 3, "Pigment dispersant A" stands for Solsperse-24000 (brand name, product of Avecia), "Pigment dispersant B" for Disperbyk-161 (brand name, product of Byk Chemie), and "PGMEA" for propylene glycol monomethyl ether acetate. In Tables 4 to 6, "BMA/MAA copolymer" stands for a benzyl methacrylate/methacrylic acid copolymer, and "DPEHA" for dipentaerythritol hexaacrylate.

<Pigment: Carbodiimide Group-Reactive Functional Group-Containing Organic Pigment>

EXAMPLES 25 TO 32 AND COMPARATIVE EXAMPLES 19 TO 20

Examples 25 and 26 are concerned with treated pigments surface-treated with the carbodiimide compound (a-1), while Examples 27 to 32 are concerned with dispersion compositions of surface-treated pigments dispersed in a dispersion medium while simultaneously surface-treating the same with the respective carbodiimide compounds.

(Preparation of Treated Pigment of Example 25 and Dispersion Composition Comprising same)

A 1,000-ml steel can containing 1,000 g of steel beads (ø 5 mm) was charged with 50 g of plasma-treated C.I. Pigment Red 122 and 450 g of purified water. This mixture was milled for 30 minutes using a paint conditioner to give an aqueous pigment dispersion. This aqueous pigment dispersion was transferred to a four-necked flask equipped with a reflux condenser, nitrogen inlet tube, stirring rod and thermometer, 50 g of the carbodiimide compound (a-1) and 170 g of propylene glycol monomethyl ether acetate were added with stirring, and the reaction was allowed to proceed at about 90° C. for 8 hours. Thereafter, the purified water and propylene glycol monomethyl ether acetate were removed, and the residue was placed in a vacuum drier and dried at 80° C. for 2 hours to give a treated pigment (surface-treated pigment of Example 25; surface-treated pigment 4) as surface-treated with the carbodiimide compound. Further, the formulation materials shown in Table 7 were kneaded together in a bead mill at a temperature of 60° C. for 1 day to give a dispersion composition comprising the surface-treated pigment of Example 25.

(Preparation of Treated Pigment of Example 26 and Dispersion Composition Comprising same)

A carbodiimide compound surface-treated pigment (surface-treated pigment of Example 26; surface-treated pigment 5) was obtained in the same manner as in Example 25. except that plasma-treated C.I. Pigment Blue 15:3 was used in lieu of the plasma-treated C.I. Pigment Red 122. Further, a dispersion composition comprising the surface-treated pigment of Example 26 was obtained by milling the formulation materials shown in Table 7 in a bead mill at a temperature of 60° C. for 1 day.

(Preparation of Dispersion Compositions of Examples 27 to 32 and Comparative Examples 19 and 20)

Carbodiimide compound surface-treated pigment dispersion compositions of Examples 27 to 32 and pigment dispersion compositions of Comparative Examples 19 and 20 were prepared each by milling the materials for each formulation given in Table 7 in a bead mill at a temperature of 60° C. for 1 day.

[Pigment Dispersion-Based Resist Compositions of Examples 25 to 32 and Comparative Examples 19 and 20 for Producing Color Filters]

Pigment dispersion-based resist compositions of Examples 25 to 32 and Comparative Examples 19 and 20 for color filters were obtained by uniformly mixing, using a high-speed stirrer, each of the pigment dispersion compositions of Examples 25 to 32 and Comparative Examples 19 and 20 with the other materials for the formulation in question given in Table 8, followed by filtration through a filter with a pore size of 3 μm.

[Evaluation Tests]

1. Dispersion Stability

The treated organic pigment dispersion compositions of Examples 25 to 32 and Comparative Examples 19 and 20 and the pigment dispersion-based resist compositions of Examples 25 to 32 and Comparative Examples 19 and 20 for color filters were each sampled and placed in a glass bottle and, after tight closure, stored at room temperature for 7 days, and the state of the composition was then evaluated according to the criteria given below. The results are shown in Tables 7 and 8.

Evaluation Criteria

A: Neither viscosity increase nor precipitate formation is observed.

B: Such an extent of viscosity increase and/or precipitate formation that can be returned to the original state upon gentle shaking is observed.

C: Such an extent of viscosity increase and/or precipitate formation that cannot be returned to the original state even upon vigorous shaking is observed.

2. Resist Pattern Developability

Those pigment dispersion-based resist compositions for color filters which had been given the evaluation A or B in the above dispersion stability evaluation were each applied to a glass substrate to a film thickness of 1 μm using a spin coater. Each coat film was prebaked at 100° C. for 3 minutes. The coat film obtained was developed using an aqueous 0.15% solution of $Na_2CO_3$, and the developability thereof was evaluated in terms of the time required for complete removal of the uncured portion of the resist composition.

The results are shown in Table 8.

A: Complete removal attainable within 30 seconds.
B: Complete removal attainable within a time longer than 30 seconds but not longer than 60 seconds.
C: No complete removal attainable even after 60 seconds.

TABLE 7

|  |  | Pigment dispersion composition | | | | | | | | | |
|---|---|---|---|---|---|---|---|---|---|---|---|
|  |  | Example | | | | | | | | Comparative Example | |
|  |  | 25 | 26 | 27 | 28 | 29 | 30 | 31 | 32 | 19 | 20 |
| Formulation of pigment dispersion composition (parts) | Surface-treated pigment 4 | 28 | — | — | — | — | — | — | — | — | — |
|  | Surface-treated pigment 5 | — | 28 | — | — | — | — | — | — | — | — |
|  | Plasma-treated C.I. Pigment Red 122 | — | — | 20 | 20 | 20 | — | — | — | — | — |
|  | Plasma-treated C.I. Pigment Blue 15:3 | — | — | — | — | — | 20 | 20 | 20 | — | — |
|  | C.I. Pigment Red 122 | — | — | — | — | — | — | — | — | 20 | — |
|  | C.I. Pigment Red 15:3 | — | — | — | — | — | — | — | — | — | 20 |
|  | Carbodiimide compound a-1 (solid) | — | — | 8 | — | — | 8 | — | — | — | — |
|  | Carbodiimide compound b-1 (solid) | — | — | — | 8 | — | — | 8 | — | — | — |
|  | Carbodiimide compound c-1 (solid) | — | — | — | — | 8 | — | — | 8 | — | — |
|  | Pigment dispersant PB821 | — | — | — | — | — | — | — | — | 8 | 8 |
|  | PGMEA | 72 | 72 | 72 | 72 | 72 | 72 | 72 | 72 | 72 | 72 |
| Total |  | 100 | 100 | 100 | 100 | 100 | 100 | 100 | 100 | 100 | 100 |
| (Evaluation) | Dispersion stability | A | A | A | A | A | A | A | A | C | C |

TABLE 8

|  |  | Pigment dispersion-based resist composition | | | | | | | | | |
|---|---|---|---|---|---|---|---|---|---|---|---|
|  |  | Example | | | | | | | | Comparative Example | |
|  |  | 25 | 26 | 27 | 28 | 29 | 30 | 31 | 32 | 19 | 20 |
| Pigment dispersion composition | Example 25 | 35 | — | — | — | — | — | — | — | — | — |
|  | Example 26 | — | 35 | — | — | — | — | — | — | — | — |
|  | Example 27 | — | — | 35 | — | — | — | — | — | — | — |
|  | Example 28 | — | — | — | 35 | — | — | — | — | — | — |
|  | Example 29 | — | — | — | — | 35 | — | — | — | — | — |
|  | Example 30 | — | — | — | — | — | 35 | — | — | — | — |
|  | Example 31 | — | — | — | — | — | — | 35 | — | — | — |
|  | Example 32 | — | — | — | — | — | — | — | 35 | — | — |
|  | Comp. Exam. 19 | — | — | — | — | — | — | — | — | 35 | — |
|  | Comp. Exam. 20 | — | — | — | — | — | — | — | — | — | 35 |
| BMA/MAA copolymer |  | 6.9 | 6.9 | 6.9 | 6.9 | 6.9 | 6.9 | 6.9 | 6.9 | 6.9 | 6.9 |
| DPEHA |  | 3 | 3 | 3 | 3 | 3 | 3 | 3 | 3 | 3 | 3 |
| Irgacure 907 |  | 1.0 | 1.0 | 1.0 | 1.0 | 1.0 | 1.0 | 1.0 | 1.0 | 1.0 | 1.0 |
| PGMEA |  | 54.1 | 54.1 | 54.1 | 54.1 | 54.1 | 54.1 | 54.1 | 54.1 | 54.1 | 54.1 |
| Total |  | 100.0 | 100.0 | 100.0 | 100.0 | 100.0 | 100.0 | 100.0 | 100.0 | 100.0 | 100.0 |
| (Evaluation) | Dispersion stability | A | A | A | A | A | A | A | A | C | C |
|  | Developability | B | B | B | A | B | B | A | B | — | — |

In Tables 7 and 8, "Pigment dispersant PB821" stands for PB821 (brand name, product of Ajinomoto), "PGMEA" for propylene glycol monomethyl ether acetate, "BMA/MAA copolymer" for a benzyl methacrylate/methacrylic acid copolymer, and "DPEHA" for dipentaerythritol hexaacrylate.

INDUSTRIAL APPLICABILITY

In accordance with the present invention, treated pigments showing good dispersibility and dispersion stability even at high concentrations when dispersed in dispersion media can be obtained. Furthermore, when pigment dispersion-based resist compositions for color filters are prepared using organic pigments (high grade organic pigments) having a functional group reactive with a carbodiimide group on the surface thereof, pigment dispersion-based resist compositions for color filters which show high transmissivity and are excellent in contrast can be obtained and, when pigment dispersion-based resist compositions for black matrices are prepared using carbon black as the pigment, pigment dispersion-based resist compositions for black matrices which show high light-shielding and high insulating properties can be obtained.

The invention claimed is:

1. A treated pigment produced by treating at least one pigment with a carbodiimide compound having one or more carbodiimide groups, wherein
   said at least one pigment is selected from the group consisting of organic pigments and carbon black each having a functional group reactive with a carbodiimide group,
   said carbodiimide compound comprising at least one side chain selected from the group consisting of polyester side chains, polyether side chains and polyacrylic side chains, and
   said carbodiimide compound has a carbodiimide equivalent of 100 to 50,000.

2. The treated pigment according to claim 1,
   wherein the carbodiimide compound is one resulting from intramolecular introduction of at least one side chain selected from the group consisting of polyester side chains, polyether side chains and polyacrylic side chains each having a functional group reactive with a carbodiimide group by reaction of the side chain with the carbodiimide group.

3. The treated pigment according to claim 1,
   wherein the carbodiimide compound is prepared by reacting
   a compound containing a carbodiimide group with
   a compound having a functional group reactive with a carbodiimide group,
   followed by intramolecular introduction of a compound forming at least one species selected from the group consisting of polyester side chains, polyether side chains and polyacrylic side chains.

4. The treated pigment according to claim 2 or 3,
   wherein the carbodiimide compound is one resulting from intramolecular introduction of the side chain having a carboxyl group, sulfonic acid group, phosphoric acid group, hydroxyl group or amino group as the functional group reactive with a carbodiimide group.

5. The treated pigment according to any one of claims 1 to 3,
   wherein the side chain is a chain having a formula weight of 200 to 10,000.

6. The treated pigment according to any one of claims 1 to 3,
   wherein the organic pigment or carbon black having a functional group reactive with a carbodiimide group has at least one functional group selected from the group consisting of a carboxyl group, sulfonic acid group, hydroxyl group and amino group.

7. A pigment dispersion composition
   which comprises the treated pigment according to any one of claims 1 to 3.

8. A pigment dispersion-based resist composition
   which comprises the treated pigment according to any one of claims 1 to 3.

9. A compound for treating an organic pigment or carbon black having a functional group reactive with a carbodiimide group
   which is a carbodiimide compound comprising at least one side chain selected from the group consisting of polyester side chains, polyether side chains and polyacrylic side chains and has a carbodiimide equivalent of 100 to 50,000.

* * * * *